(12) United States Patent
Li et al.

(10) Patent No.: US 10,608,174 B2
(45) Date of Patent: Mar. 31, 2020

(54) DOUBLE-PATTERNED MAGNETO-RESISTIVE RANDOM ACCESS MEMORY (MRAM) FOR REDUCING MAGNETIC TUNNEL JUNCTION (MTJ) PITCH FOR INCREASED MRAM BIT CELL DENSITY

(71) Applicant: QUALCOMM Incorporated, San Diego, CA (US)

(72) Inventors: Xia Li, San Diego, CA (US); Wei-Chuan Chen, Scarsdale, NY (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/523,682

(22) Filed: Jul. 26, 2019

(65) Prior Publication Data
US 2019/0348602 A1    Nov. 14, 2019

Related U.S. Application Data

(62) Division of application No. 15/868,367, filed on Jan. 11, 2018, now Pat. No. 10,446,743.

(51) Int. Cl.
*H01L 43/12* (2006.01)
*H01L 43/08* (2006.01)
*H01L 43/02* (2006.01)
*G11C 11/16* (2006.01)
(Continued)

(52) U.S. Cl.
CPC ............ *H01L 43/12* (2013.01); *G11C 11/161* (2013.01); *G11C 11/1655* (2013.01);
(Continued)

(58) Field of Classification Search
CPC ......... H01L 43/02; H01L 43/08; H01L 43/10; H01L 43/12; H01L 27/222; H01L 27/224;
(Continued)

(56) References Cited

U.S. PATENT DOCUMENTS 7,719,885 B2    5/2010  Hidaka
7,893,511 B2 *  2/2011  Ruehrig ................ H01L 27/222
                                                                257/421
(Continued)

OTHER PUBLICATIONS

International Search Report and Written Opinion for International Patent Application No. PCT/US2018/067036, dated Jul. 8, 2019, 18 pages.

*Primary Examiner* — Allison Bernstein
(74) *Attorney, Agent, or Firm* — W&T/Qualcomm

(57) ABSTRACT

Double-patterned magneto-resistive random access memory (MRAM) for reducing magnetic tunnel junction (MTJ) pitch for increased MRAM bit cell density is disclosed. In one aspect, to fabricate MTJs in an MRAM array with reduced MTJ row pitch, a first patterning process is performed to provide separation areas in an MTJ layer between what will become rows of fabricated MTJs, which facilitates MTJs in a given row sharing a common bottom electrode. This reduces the etch depth and etching time needed to etch the individual MTJs in a subsequent step, can reduce lateral projections of sidewalls of the MTJs, thereby relaxing the pitch between adjacent MTJs, and may allow an initial MTJ hard mask layer to be reduced in height. A subsequent second patterning process is performed to fabricate individual MTJs. Additional separation areas are etched between free layers of adjacent MTJs in a given row to fabricate the individual MTJs.

11 Claims, 18 Drawing Sheets

(51) Int. Cl.
*H01L 27/22* (2006.01)
*H01F 10/32* (2006.01)
*H01L 43/10* (2006.01)

(52) U.S. Cl.
CPC ...... *G11C 11/1673* (2013.01); *G11C 11/1675* (2013.01); *G11C 11/1695* (2013.01); *H01F 10/329* (2013.01); *H01F 10/3254* (2013.01); *H01L 27/228* (2013.01); *H01L 43/02* (2013.01); *H01L 43/08* (2013.01); *H01L 43/10* (2013.01)

(58) Field of Classification Search
CPC ............. H01L 27/228; G11C 11/14–16; G11C 11/161
See application file for complete search history.

(56) References Cited

U.S. PATENT DOCUMENTS

| | | |
|---|---|---|
| 7,985,667 B2 | 7/2011 | Cho |
| 8,536,063 B2 | 9/2013 | Satoh et al. |
| 9,129,690 B2 | 9/2015 | Park et al. |
| 9,525,125 B1 | 12/2016 | Annunziata et al. |
| 9,543,502 B2 | 1/2017 | Zou et al. |
| 9,679,781 B2 | 6/2017 | Abatchev et al. |
| 2011/0111532 A1 | 5/2011 | Ryu et al. |
| 2012/0028373 A1 | 2/2012 | Belen et al. |
| 2016/0351238 A1 | 12/2016 | Doyle et al. |
| 2016/0351799 A1 | 12/2016 | Xue et al. |
| 2017/0125668 A1 | 5/2017 | Paranjpe et al. |
| 2019/0214554 A1 | 7/2019 | Li et al. |
| 2019/0267066 A1* | 8/2019 | Takaya .................... H01L 43/02 |

\* cited by examiner

DOUBLE-PATTERNED MAGNETO-RESISTIVE RANDOM ACCESS MEMORY (MRAM) FOR REDUCING MAGNETIC TUNNEL JUNCTION (MTJ) PITCH FOR INCREASED MRAM BIT CELL DENSITY

PRIORITY APPLICATIONS

The present application is a divisional of and claims priority to U.S. patent application Ser. No. 15/868,367, now U.S. Pat. No. 10,446,743, filed on Jan. 11, 2018 and entitled "DOUBLE-PATTERNED MAGNETO-RESISTIVE RANDOM ACCESS MEMORY (MRAM) FOR REDUCING MAGNETIC TUNNEL JUNCTION (MTJ) PITCH FOR INCREASED MRAM BIT CELL DENSITY," the disclosure of which is incorporated herein by reference in its entirety.

BACKGROUND

I. Field of the Disclosure

The technology of the disclosure relates generally to magneto-resistive random access memory (MRAM) and, more particularly, to fabricating magnetic tunnel junctions (MTJs) for MRAM bit cells in a semiconductor die to provide an MRAM.

II. Background

Semiconductor storage devices are used in integrated circuits (ICs) in electronic devices to provide data storage. One example of a semiconductor storage device is magneto-resistive random access memory (MRAM). MRAM is non-volatile memory in which data is stored by programming a magnetic tunnel junction (MTJ) as part of an MRAM bit cell. One advantage of MRAM is that MTJs in MRAM bit cells can retain stored information even when power is turned off. This is because data is stored in the MTJ as a small magnetic element rather than as an electric charge or current.

In this regard, an MTJ comprises a free ferromagnetic layer ("free layer") disposed above or below a fixed or pinned ferromagnetic layer ("pinned layer"). The free and pinned layers are separated by a tunnel junction or barrier formed by a thin non-magnetic dielectric layer. The magnetic orientation of the free layer can be changed, but the magnetic orientation of the pinned layer remains fixed or "pinned." Data can be stored in the MTJ according to the magnetic orientation between the free and pinned layers. When the magnetic orientations of the free and pinned layers are anti-parallel (AP) to each other, a first memory state exists (e.g., a logical '1'). When the magnetic orientations of the free and pinned layers are parallel (P) to each other, a second memory state exists (e.g., a logical '0'). The magnetic orientations of the free and pinned layers can be sensed to read data stored in the MTJ by sensing a resistance when current flows through the MTJ. Data can also be written and stored in the MTJ by applying a magnetic field to change the orientation of the free layer to either a P or AP magnetic orientation with respect to the pinned layer.

Recent developments in MTJ devices involve spin transfer torque (STT)-MRAM devices. In STT-MRAM devices, the spin polarization of carrier electrons, rather than a pulse of a magnetic field, is used to program the state stored in the MTJ (i.e., a '0' or a '1'). FIG. 1 illustrates an MTJ 100. The MTJ 100 is provided as part of an MRAM bit cell 102 to store non-volatile data. A metal-oxide semiconductor (MOS) (typically n-type MOS, i.e., NMOS) access transistor 104 is provided to control reading and writing to the MTJ 100. A drain (D) of the access transistor 104 is coupled to a bottom electrode 106 of the MTJ 100, which is coupled to a pinned layer 108, for example. A word line (WL) is coupled to a gate (G) of the access transistor 104. A source (S) of the access transistor 104 is coupled to a voltage source $V_S$ through a source line (SL). The voltage source $V_S$ provides a voltage $V_{SL}$ on the source line (SL). A bit line (BL) is coupled to a top electrode 110 of the MTJ 100, which is coupled to a free layer 112, for example. The pinned layer 108 and the free layer 112 are separated by a tunnel barrier 114.

With continuing reference to FIG. 1, when reading data from the MRAM bit cell 102, the gate (G) of the access transistor 104 is activated by activating the word line (WL). A voltage differential between a voltage $V_{BL}$ on the bit line (BL) and the voltage $V_{SL}$ on the source line (SL) is applied to generate a read current $I_R$ as a function the resistance of the MTJ 100. The resistance of the MTJ 100 is higher when the magnetic orientation of the free layer 112 is in an AP orientation than a P orientation with respect to the pinned layer 108. When writing data to the MTJ 100, the gate (G) of the access transistor 104 is activated by activating the word line (WL). A voltage differential between the voltage $V_{BL}$ on the bit line (BL) and the voltage $V_{SL}$ on the source line (SL) is applied. As a result, a write current $I_W$ is generated between the drain (D) and the source (S) of the access transistor 104. If the magnetic orientation of the MTJ 100 in FIG. 1 is to be changed from AP to P, a write current $I_{AP-P}$ flowing from the free layer 112 to the pinned layer 108 is generated, which induces an STT at the free layer 112 to change the magnetic orientation of the free layer 112 to P with respect to the pinned layer 108. If the magnetic orientation is to be changed from P to AP, a write current $I_{P-AP}$ flowing from the pinned layer 108 to the free layer 112 is produced, which induces an STT at the free layer 112 to change the magnetic orientation of the free layer 112 to AP with respect to the pinned layer 108.

MRAM may be useful as an on-chip memory because of its non-volatile data retention capabilities. However, since ICs have limited space, on-chip memory must occupy a small amount of area on the IC. Thus, it is desired to reduce the footprint of MRAM to increase MRAM bit cell density for a given area. One way to reduce the footprint of MRAM is to reduce the pitch distance ("pitch" between MTJs, or "MTJ pitch") in MRAM bit cells fabricated in an MRAM array. MTJ pitch in an MRAM array is the distance between MTJs in adjacent MRAM bit cells measured from a common point in each MTJ. If MTJ pitch is reduced while retaining the structural characteristics required for an MTJ to function properly, more MTJs can be fabricated in a given area on the chip to increase MRAM bit cell density in an MRAM array. However, conventional fabrication processes face a trade-off between reducing MTJ pitch and retaining the structural characteristics required for an MTJ to function as desired.

To ensure MTJs retain structural characteristics required for desired operation, MTJs are conventionally fabricated with an MTJ pitch sufficient to provide a desired tunnel magnetoresistance (TMR) and to limit and/or eliminate sidewall damage and short circuits caused by re-deposition of metal material on sidewalls of the MTJ, as examples. To provide such structural characteristics, MTJs are conventionally etched using reactive ion etching (RIE) to provide desired sidewall verticality and open-circuit separation between MTJs. To protect MTJs during etching, a hard mask is conventionally formed above each MTJ in a semiconductor die. Once etched using RIE, the MTJs are then conventionally over-etched using angled ion beam etching (IBE) to remove sidewall re-deposition caused by the RIE process and to prevent the bottom electrodes of adjacent MTJs from being electrically shorted. If the MTJs are over-etched too little, a bottom electrode of one MTJ might contact a bottom electrode of an adjacent MTJ, causing an electrical short. However, if the MTJs are over-etched too much, this over-etching can cause additional re-deposition of metal materials on adjacent MTJs (e.g., re-deposition of the bottom electrode or re-deposition of metal lines below the MTJs, on adjacent MTJs), which can also cause an electrical short. Further, too much over-etching can reduce the thickness of the hard mask over each MTJ beyond design margins, thereby making each MTJ vulnerable to an electrical short caused by a top metal line. Thus, over-etching processes must be executed within a certain margin to avoid electrical shorts.

SUMMARY OF THE DISCLOSURE

Aspects disclosed in the detailed description include double-patterned magneto-resistive random access memory (MRAM) for reducing magnetic tunnel junction (MTJ) pitch for increased MRAM bit cell density. Reducing MTJ pitch facilitates further scaling of MRAM to increase MRAM bit cell density. The height of an MTJ and its MTJ hard mask can limit the minimum MTJ pitch in MRAM, because deeper etching processes to fabricate taller MTJs can make it more difficult to achieve electrical separation between etched MTJs to avoid shorting. Increasing etch width to achieve enhanced separation risks damaging the sidewalls of the MTJs, which could reduce MTJ performance as a result. Thus, in aspects disclosed herein, MTJs in an MRAM array are fabricated with a reduced MTJ row pitch by employing a double-patterning process. In this regard, a first patterning process is performed to provide separation areas in an MTJ layer between what will become rows of fabricated MTJs. Etching these separation areas facilitates MTJs in a given row sharing a common bottom electrode. This avoids having to etch at least a bottom electrode layer between adjacent MTJs in a given row in a further etching process step when forming the individual MTJs, thus reducing the etch depth and etching time needed to etch the individual MTJs in a subsequent process step. Reducing the etch depth and etching time to fabricate the individual MTJs can also reduce lateral projections of the sidewalls of the MTJs, thereby relaxing the pitch between adjacent MTJs without shorting adjacent MTJs. Also, allowing the individual MTJs to be fabricated in a subsequent process step with reduced etching may also allow the initial MTJ hard mask layer to be reduced in height, thus further reducing the area of the MRAM array.

A subsequent second patterning process is performed to fabricate the individual MTJs that will each be associated with an MRAM bit cell in the MRAM array. Additional separation areas are etched between adjacent MTJs in their respective given row and between adjacent MTJs in different adjacent rows to fabricate the individual MTJs for the MRAM bit cells in the MRAM array.

Thus for example, through this double-patterning process, MTJ row pitch can be reduced by providing a common bottom electrode for MTJs in a given row while reducing the etching depth required in the second patterning process to fabricate individual MTJ stacks.

In this regard in one exemplary aspect, a method of fabricating a plurality of rows of MTJs in an MRAM array precursor stack is provided. The MRAM array precursor stack includes an interconnect layer including a plurality of rows of vias each disposed along respective first longitudinal axes and each separated by a respective first separation area along respective second longitudinal axes. The MRAM array precursor stack also includes a bottom electrode layer disposed above the interconnect layer, a first magnetization layer disposed above the bottom electrode layer, a tunnel barrier layer disposed above the first magnetization layer, and a second magnetization layer disposed above the tunnel barrier layer. A mask stack layer is also included in the MRAM array precursor stack and is disposed above the second magnetization layer. The method of fabricating a plurality of rows of MTJs in an MRAM array precursor stack includes patterning a plurality of second separation areas of a first depth in the mask stack layer aligned along the respective second longitudinal axes and then etching the plurality of second separation areas to a second depth in the mask stack layer below the first depth. The method also includes patterning a plurality of third separation areas of a third depth to a top surface of the second magnetization layer aligned along the respective first longitudinal axes, wherein each third separation area among the plurality of third separation areas is between vertical projections of longitudinally adjacent vias. The method then includes etching the plurality of second separation areas to the interconnect layer and etching the plurality of third separation areas to below the second magnetization layer to form a plurality of rows of common bottom electrodes along the respective first longitudinal axes. In this regard, each common bottom electrode of the plurality of rows of common bottom electrodes is coupled to a plurality of MTJ stacks and each MTJ stack is separated by an etched third separation area of the etched plurality of third separation areas.

In another exemplary aspect, an MRAM array in a semiconductor die is provided. The MRAM array includes a first MTJ hard mask disposed over a first MTJ stack and a second MTJ hard mask disposed over a second MTJ stack. The first MTJ stack is coupled to a common bottom electrode row, and includes a first free layer, a first pinned layer, and a first tunnel barrier between the first free layer and the first pinned layer. The second MTJ stack is laterally adjacent to the first MTJ stack and is coupled to the same common bottom electrode row. The second MTJ stack includes a second free layer, a second pinned layer, and a second tunnel barrier between the second free layer and the second pinned layer. The first MTJ hard mask has a thickness less than fifty-five (55) nanometers (nm) and the second MTJ hard mask has a thickness less than 55 nm. The structure of the first MTJ hard mask over the first MTJ stack has a sidewall angle between approximately 60 degrees and 80 degrees and the structure of the second MTJ hard mask over the second MTJ stack has a sidewall angle between approximately 60 degrees and 80 degrees. Additionally, the first MTJ stack is separated from the second MTJ stack by a pitch less than 21 nm.

In another exemplary aspect, an MRAM bit cell circuit is provided. The MRAM bit cell circuit includes a first row of a plurality of MRAM bit cells comprising a first common bottom electrode. Each MRAM bit cell of the first row is in a column of a plurality of columns. Each MRAM bit cell of the first row includes a first top electrode, a first MTJ stack between the first top electrode and the first common bottom electrode, and a first access transistor coupled to the first common bottom electrode. The first MTJ stack includes a first pinned layer, a first free layer, and a first tunnel barrier between the first pinned layer and the first free layer. The exemplary MRAM bit cell circuit also includes a first word line (WL) coupled to a gate of each first access transistor of the first row of the plurality of MRAM bit cells. The MRAM bit cell circuit includes a bit line (BL) column selector and driver circuit and a source line (SL) column selector and driver circuit. The bit line (BL) column selector and driver circuit includes a plurality of bit line (BL) outputs and a plurality of bit lines (BLs). Each bit line (BL) is coupled to the first top electrode of an MRAM bit cell in a respective column and to a corresponding bit line (BL) output. The source line (SL) column selector and driver circuit includes a plurality of source line (SL) outputs and a plurality of source lines (SLs). Each source line (SL) is coupled to the first access transistor of an MRAM bit cell in a respective column and to a corresponding source line (SL) output. The MRAM bit cell circuit further includes an enable input configured to receive an enable signal and a memory address input configured to receive a memory address.

In another exemplary aspect, a means for storing data in an array in a semiconductor die is provided. The means for storing data in an array includes a first means for protecting a first means for storing data disposed over the first means for storing data. The first means for storing data is coupled to a common means for conducting current. The first means for storing data includes a first means for storing a programmable magnetic moment having a first programmable magnetic moment, a first means for storing a fixed magnetic moment having a first fixed magnetic moment, and a first means for transferring spin polarization of electrons disposed between the first means for storing the fixed magnetic moment and the first means for storing the programmable magnetic moment. The means for storing data in an array also includes a second means for protecting a second means for storing data disposed over the second means for storing data. The second means for storing data is laterally adjacent to the first means for storing data and is coupled to the common means for conducting current. The second means for storing data includes a second means for storing a programmable magnetic moment having a second programmable magnetic moment, a second means for storing a fixed magnetic moment having a second fixed magnetic moment, and a second means for transferring spin polarization of electrons disposed between the second means for storing the fixed magnetic moment and the second means for storing the programmable magnetic moment. The first means for protecting the first means for storing data has a thickness less than 55 nm and the second means for protecting the second means for storing data has a thickness less than 55 nm. The first means for storing data and the first means for protecting the first means for storing data have a sidewall angle between approximately 60 degrees and 80 degrees. The second means for storing data and the second means for protecting the second means for storing data also have a sidewall angle between approximately 60 degrees and 80 degrees. The first means for storing data is separated from the second means for storing data by a pitch less than 21 nm.

DETAILED DESCRIPTION

Figure 1:
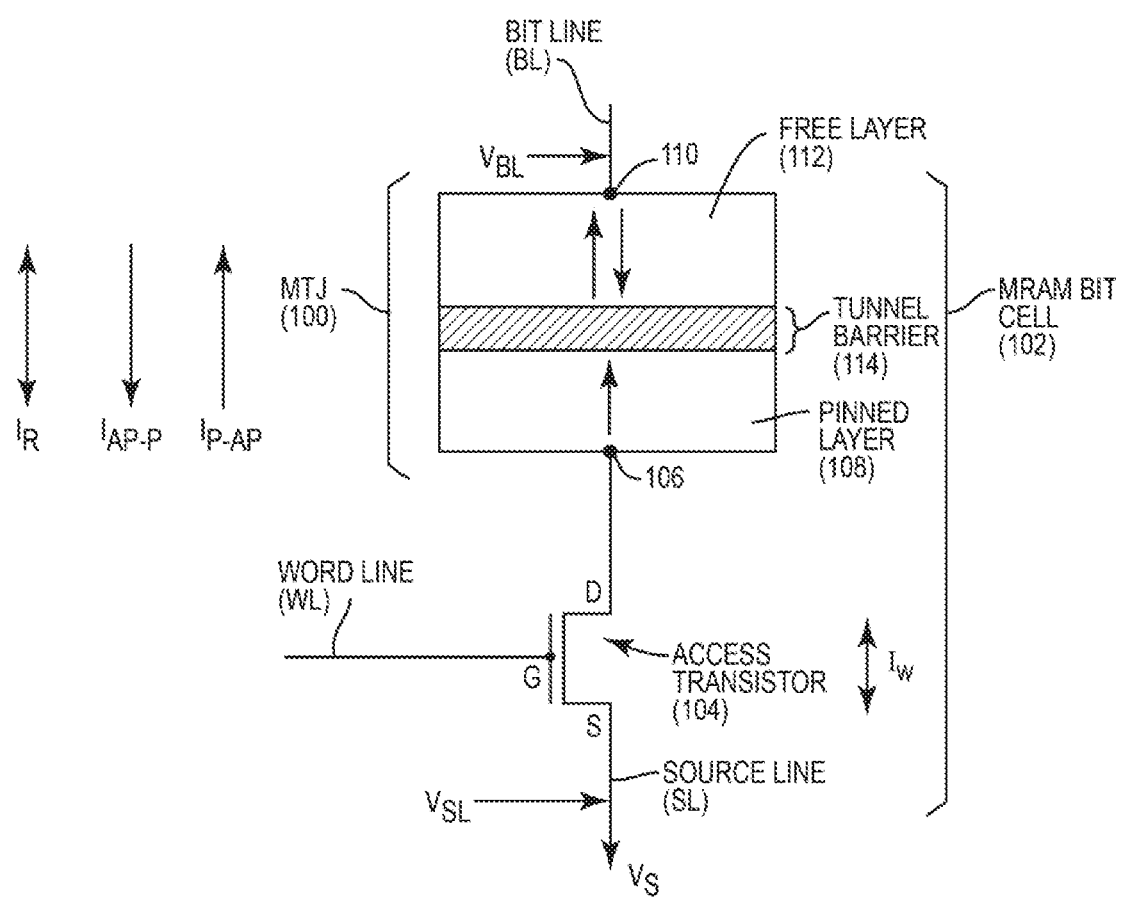
FIG. 1 is a schematic diagram of an exemplary magneto-resistive random access memory (MRAM) bit cell that can be provided in an MRAM array in an MRAM.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include double-patterned magneto-resistive random access memory (MRAM) for reducing magnetic tunnel junction (MTJ) pitch for increased MRAM bit cell density. Reducing MTJ pitch facilitates further scaling of MRAM to increase MRAM bit cell density. The height of an MTJ and its MTJ hard mask can limit the minimum MTJ pitch in MRAM, because deeper etching processes to fabricate taller MTJs can make it more difficult to achieve electrical separation between etched MTJs to avoid shorting. Increasing etch width to achieve enhanced separation risks damaging the sidewalls of the MTJs, which could reduce MTJ performance as a result. Thus, in aspects disclosed herein, MTJs in an MRAM array are fabricated with a reduced MTJ row pitch by employing a double-patterning process. In this regard, a first patterning process is performed to provide separation areas in an MTJ layer between what will become rows of fabricated MTJs. Etching these separation areas facilitates MTJs in a given row sharing a common bottom electrode. This avoids having to etch at least a bottom electrode layer between adjacent MTJs in a given row in a further etching process step when forming the individual MTJs, thus reducing the etch depth and etching time needed to etch the individual MTJs in a subsequent process step. Reducing the etch depth and etching time to fabricate the individual MTJs can also reduce lateral projections of the sidewalls of the MTJs, thereby relaxing the pitch between adjacent MTJs without shorting adjacent MTJs. Also, allowing the individual MTJs to be fabricated in a subsequent process step with reduced etching may also allow the initial MTJ hard mask layer to be reduced in height, thus further reducing the area of the MRAM array.

A subsequent second patterning process is performed to fabricate the individual MTJs that will each be associated with an MRAM bit cell in the MRAM array. Additional separation areas are etched between adjacent MTJs in their respective given row and between adjacent MTJs in different adjacent rows to fabricate the individual MTJs for the MRAM bit cells in the MRAM array.

Thus for example, through this double-patterning process, MTJ row pitch can be reduced by providing a common bottom electrode for MTJs in a given row while reducing the etching depth required in the second patterning process to fabricate individual MTJ stacks.

Figure 2A:
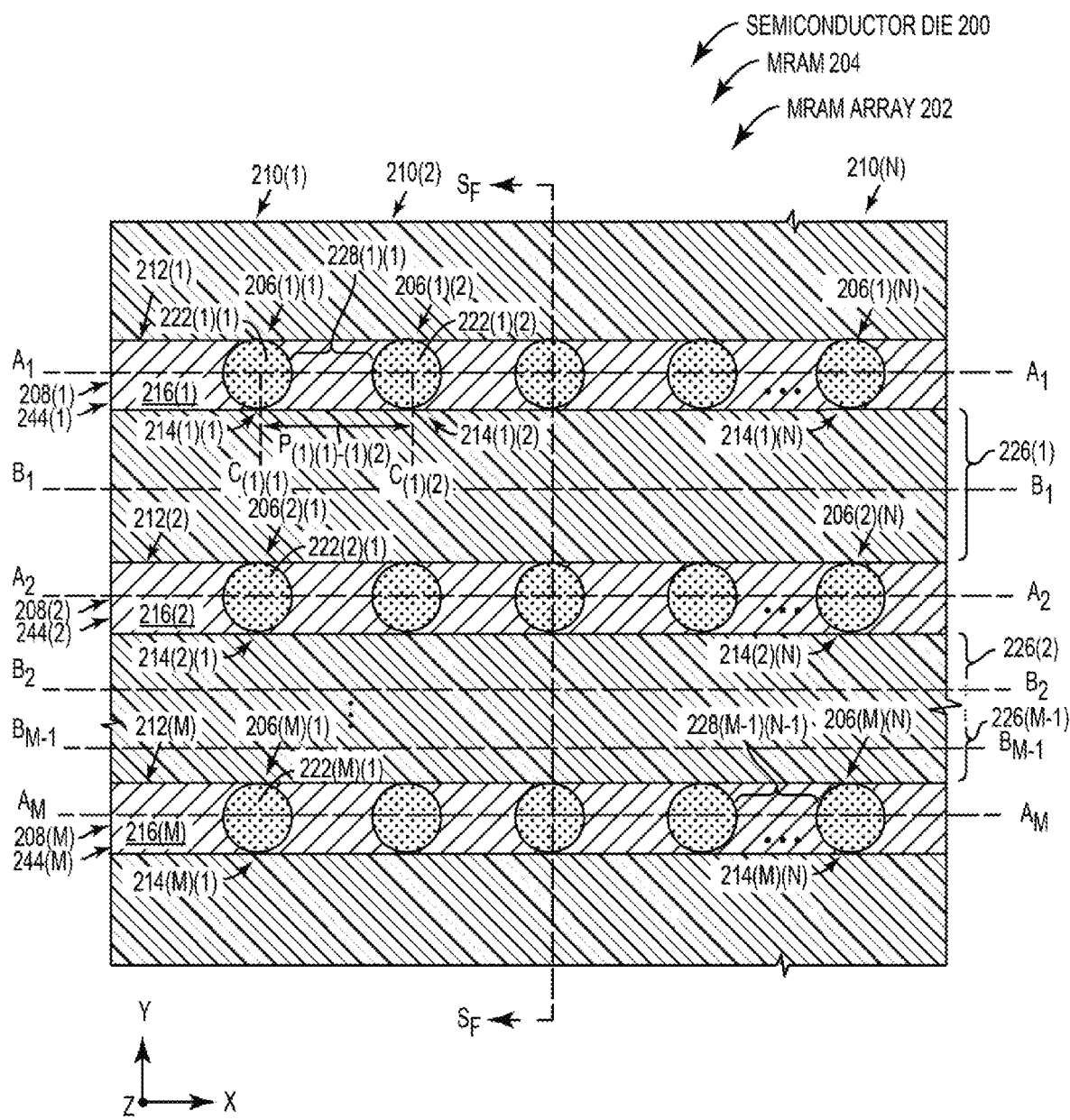
FIG. 2A is a top-view diagram of an exemplary double-patterned MRAM array having rows of MTJs, wherein each row of MTJs has a common bottom electrode to reduce MTJ pitch to increase MRAM bit cell density.
Figure 2B:
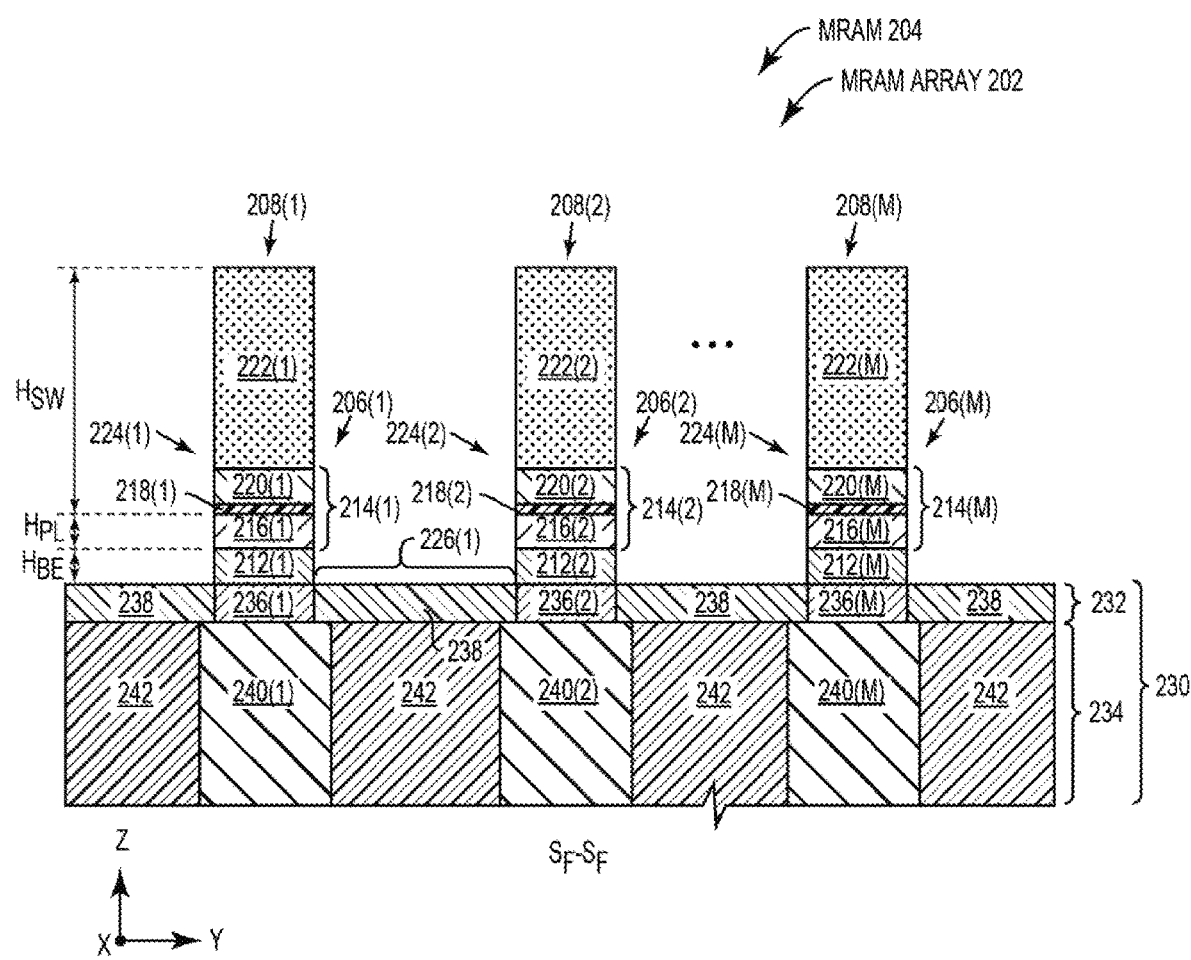
FIG. 2B is a cross-sectional, side-view diagram of the MRAM array in FIG. 2A illustrating exemplary MTJs of the MRAM array.

Before discussing an exemplary double-patterning process that can be used to fabricate MTJs for MRAM bit cells in an MRAM array with a reduced MTJ pitch to provide for increased MRAM bit cell density, FIGS. 2A and 2B are first discussed. FIGS. 2A and 2B illustrate a top-view and a side-view, respectively, of an exemplary semiconductor die 200 including a double-patterned MRAM array 202 for an MRAM 204 having a plurality of MTJs 206(1)(1)-206(M)(N). The MTJs 206(1)(1)-206(M)(N) of the MRAM array 202 are organized in rows 208(1)-208(M) and columns 210(1)-210(N). As will be discussed in more detail below, a common bottom electrode 212(1)-212(M) s provided for each row 208(1)-208(M) of MTJs 206(1)( )-206(M)( ). This allows an MTJ pitch P between adjacent MTJs 2060(1)-2060(N) of a given row 208(1)-208(M) to be decreased. By decreasing the MTJ pitch P between adjacent MTJs 2060(1)-2060(N) of a given row 208(1)-208(M), MRAM bit cells formed from the MTJs 206(1)(1)-206(M)(N) can be provided in an MRAM with increased MRAM bit cell density, as discussed further below.

In this regard, FIG. 2A illustrates a top-view of the exemplary semiconductor die 200 that includes the double-patterned MRAM array 202 for the MRAM 204. The MRAM array 202 includes the MTJs 206(1)(1)-206(M)(N) organized in the rows 208(1)-208(M). Each of the rows 208(1)-208(M) of MTJs 206(1)( )-206(M)( ) is disposed along a respective first longitudinal axis $A_1$-$A_M$ that is parallel or substantially parallel to the other longitudinal axes $A_1$-$A_M$ in the X-axis direction as shown. In this example, the MTJs 206(1)(1)-206(M)(N) are organized in '1-M' rows labeled rows 208(1)-208(M) and '1-N' columns labeled columns 210(1)-210(N) in the semiconductor die 200, as shown in FIG. 2A. As an example, the semiconductor die 200 in FIG. 2A can be a semiconductor die of a system-on-a-chip (SoC).

Each row 208(1)-208(M) of MTJs 206(1)( )-206(M)( ) includes a respective common bottom electrode 212(1)-212(M). Each common bottom electrode 212(1)-212(M) is coupled to a respective plurality of MTJ stacks 214(1)(1)-214(M)(N) (further illustrated in FIG. 2B). In this example, each row 208(1)-208(M) of MTJs 206(1)( )-206(M)( ) includes 1-N columns of MTJ stacks 214( )(1)-214( )(N) coupled to a respective common bottom electrode 212(1)-212(M), wherein MTJ stacks 214( )(1)-214( )(N) in a given row 208(1)-208(M) are disposed in respective columns 210(1)-210(N). The distance between adjacent MTJs 2060(1)-2060(N) of a respective common bottom electrode 212(1)-212(M) measured from a common point in each MTJ 206(1)(1)-206(M)(N) provides the MTJ row pitch P. For example, as shown in FIG. 2A, the MTJ row pitch $P_{(1)(1)-(1)(2)}$ is the distance between the first MTJ 206(1)(1) of the first row 208(1) of MTJs 206(1)(1)-206(1)(N) and the second MTJ 206(1)(2) of the first row 208(1) of MTJs 206(1)(1)-206(1)(N) as measured from a horizontal center $C_{(1)(1)}$ and $C_{(1)(2)}$ of each MTJ 206(1)(1) and 206(1)(2). In aspects disclosed herein, MTJ column or row pitch can be approximately 9 nm for stand-alone MTJ configurations and approximately 21 nm for embedded MRAM configurations for 3 nm technology when keeping the same MTJ cell technology size ratio ($F^2$), wherein F is the technology minimum size. In some aspects disclosed herein, MTJ column or row pitch can be less than 9 nm for stand-alone MTJ configurations and less than 21 nm for embedded MRAM configurations for 3 nm technology. As discussed in detail below, the MRAM 204 employing the MRAM array 202 illustrated in FIG. 2A can be configured to employ an architecture that supports read and write operations in the rows 208(1)-208(M) of MTJs 206(1)( )-206(M)( ) formed as MRAM bit cells of the MRAM 204, with each row 208(1)-208(M) having a respective common bottom electrode 212(1)-212(M).

To further illustrate the exemplary MRAM array 202 shown in FIG. 2A, FIG. 2B is discussed here in conjunction with FIG. 2A. FIG. 2B illustrates a cross-sectional, side-view along the cross-section $S_F$-$S_F$ in FIG. 2A. In this regard, FIG. 2B illustrates exemplary MTJs 206(1)-206(M) in respective rows 208(1)-208(M) of MTJs 206(1)( )-206(M)( ) of the MRAM array 202 formed in the semiconductor die 200 at different locations along a respective row 208(1)-208(M) in the Y-axis direction. For purposes of this example, each MTJ 206(1)-206(M) illustrated in FIG. 2B is an exemplary MTJ representing every MTJ 206( )(1)-206( )(N) of a respective row 208(1)-208(M) shown in FIG. 2A that can be disposed left and right of each exemplary MTJ 206(1)-206(M) in the X-axis direction. As discussed above, each row 208(1)-208(M) of MTJs 206(1)( )-206(M)( ) in this example includes a respective common bottom electrode 212(1)-212(M). As shown in FIG. 2B, each MTJ stack 214(1)-214(M) of a respective exemplary MTJ 206(1)-206(M) is disposed over a respective common bottom electrode 212(1)-212(M). Each MTJ stack 214(1)-214(M) includes a pinned layer 216(1)-216(M), a tunnel barrier 218(1)-218(M), and a free layer 220(1)-220(M), wherein each tunnel barrier 218(1)-218(M) is between a respective pinned layer 216(1)-216(M) and a respective free layer 220(1)-220(M). In this regard, each MTJ 206(1)-206(M) has a magnetic moment $M_{FL}$ of each free layer 220(1)-220(M) that can be changed, but a magnetic moment $M_{PL}$ of each pinned layer 216(1)-216(M) that remains fixed or "pinned."

Each MTJ stack 214(1)-214(M) is configured to store data according to the magnetic moment $M_{FL}$ of its free layer 220(1)-220(M) as being either parallel (P) or anti-parallel (AP) to the magnetic moment $M_{PL}$ of its pinned layer 216(1)-216(M) to represent different memory states (i.e., a logical '1' or '0'). To read data stored in a given MTJ 206(1)-206(M), a voltage differential can be applied across the respective MTJ 206(1)-206(M) to generate a read current as a function of the resistance of the respective MTJ 206(1)-206(M). Since the resistance of a given MTJ 206(1)-206(M) is higher when the magnetic moment $M_{FL}$ of a respective free layer 220(1)-220(M) is in an AP orientation than a P orientation with respect to a respective pinned layer 216(1)-216(M), a lower read current can be measured when the given MTJ 206(1)-206(M) is in an AP orientation than a P orientation with respect to the respective pinned layer 216(1)-216(M). In this manner, a lower measured read current can indicate that the data stored in the given MTJ 206(1)-206(M) is a logical '1,' and a higher measured read current can indicate that the data stored in the given MTJ 206(1)-206(M) is a logical '0.' When writing data to a given MTJ 206(1)-206(M), a voltage differential can be applied across the MTJ 206(1)-206(M) to generate a write current. If the magnetic orientation $M_{FL}$ of the free layer 220(1)-220(M) of the given MTJ 206(1)-206(M) is to be changed from an AP orientation to a P orientation, a write current flowing from the free layer 220(1)-220(M) to the respective pinned layer 216(1)-216(M) can be generated, which induces a spin transfer torque (STT) at the free layer 220(1)-220(M) to change the magnetic orientation $M_{FL}$ of the free layer 220(1)-220(M) to P with respect to the pinned layer 216(1)-216(M). If the magnetic orientation $M_{FL}$ of the free layer 220(1)-220(M) is to be changed from P to AP, a write current flowing from the pinned layer 216(1)-216(M) to the free layer 220(1)-220(M) can be produced, which induces an STT at the free layer 220(1)-220(M) to change the magnetic orientation $M_{FL}$ of the free layer 220(1)-220(M) to AP with respect to the pinned layer 216(1)-216(M). In this regard, read and write operations can be performed on a given MTJ 206(1)-206(M) to retrieve and store data according to the magnetic moment $M_{FL}$ of the free layer 220(1)-220(M) of the MTJ 206(1)-206(M).

As shown in FIGS. 2A and 2B, although not required, each pinned layer 216(1)-216(M) in this example is a common pinned layer 216(1)-216(M). In this regard, each exemplary MTJ 206(1)-206(M) in FIGS. 2A and 2B includes a common pinned layer 216(1)-216(M) over, and coupled to, a respective common bottom electrode 212(1)-212(M). In some aspects, each MTJ 206(1)-206(M) also includes a common tunnel barrier over each common pinned layer 216(1)-216(M). In other aspects, each MTJ 206(1)-206(M) includes a non-common pinned layer separate from the non-common pinned layers of other MTJs 206(1)-206(M). In yet other aspects, each MTJ 206(1)-206(M) includes, in ascending order, the common bottom electrode 212(1)-212(M), a non-common free layer 220(1)-220(M), a non-common tunnel barrier 218(1)-218(M), and a non-common pinned layer 216(1)-216(M). In this example, as shown in FIG. 2B, the free layer 220(1)-220(M) of each MTJ stack 214(1)-214(M) is over a respective tunnel barrier 218(1)-218(M) and each tunnel barrier 218(1)-218(M) is over a respective common pinned layer 216(1)-216(M). FIGS. 2A and 2B also illustrate a respective MTJ hard mask 222(1)-222(M) disposed over each MTJ stack 214(1)-214(M) to protect each MTJ stack 214(1)-214(M) from damage that can result from fabrication processes. In this manner, each MTJ hard mask 222(1)-222(M) disposed over a respective MTJ stack 214(1)-214(M) forms respective MTJ sidewalls 224(1)-224(M) of the MTJ hard mask 222(1)-222(M) and MTJ stack 214(1)-214(M) structure.

As further illustrated in FIGS. 2A and 2B, the rows 208(1)-208(M) of MTJs 206(1)-206(M) are separated from one another in the Y-axis direction by row separation areas 226(1)-226(M-1) located between each row 208(1)-208(M) of MTJs 206(1)-206(M) along respective second longitudinal axes $B_1$-$B_{M-1}$ that are parallel or substantially parallel to each other in the X-axis direction as shown. For example, as shown in FIGS. 2A and 2B, the first row separation area 226(1) is patterned to be between the first row 208(1) and the second row 208(2). The row separation areas 226(1)-226(M-1) allow a common bottom electrode 212(1)-212(M) to be formed for the MTJs 206(1)-206(M) of each row 208(1)-208(M) by providing space and/or a substantially non-conductive material between bottom electrodes 212(1)-212(M) adjacent in the Y-axis direction. By patterning the row separation areas 226(1)-226(M-1) to allow a common bottom electrode 212(1)-212(M) to be formed for each row 208(1)-208(M) of MTJs 206(1)( )-206(M)( ) in the MRAM array 202, portions of each common bottom electrode 212(1)-212(M) between adjacent MTJs 206( )(1)-206( )(N) of a given row 208(1)-208(M) do not need to be removed when fabricating the MTJs 206(1)-206(M). In this regard, when forming the individual MTJs 206( )(1)-206( )(N) of each row 208(1)-208(M) in FIGS. 2A and 2B, cell separation areas 228(1)(1)-228(M-1)(N-1) patterned to be between adjacent MTJs 2060(1)-2060(N) of a row 208(1)-208(M) of MTJs 206(1)( )-206(M)( ) do not have to extend deeper than a top surface of a respective common bottom electrode 212(1)-212(M). Thus, etching processes used to remove portions of each common bottom electrode 212(1)-212(M) between adjacent MTJs 206( )(1)-206( )(N) of a given row 208(1)-208(M) in the MRAM array 202 to increase the depth of the cell separation areas 228(1)(1)-228(M-1)(N-1) can be avoided and/or eliminated. In this manner, the etching depth for forming the individual MTJs 2060(1)-2060(N) of a given row 208(1)-208(M) and the amount of time spent performing etching processes can be reduced.

By reducing the etching depth required to form the individual MTJs 206( )(1)-206( )(N) of a given row 208(1)-208(M) and reducing the time spent performing such etching processes, the thickness of each MTJ hard mask 222(1)(1)-222(M)(N) used to protect a respective MTJ 206(1)(1)-206(M)(N) in the MRAM array 202 during etching can be reduced. This is because reducing the amount of time spent etching a respective cell separation area 228(1)(1)-228(M-1)(N-1) reduces the amount of time spent etching the given MTJ hard mask 222(1)(1)-222(M)(N), thereby reducing MTJ hard mask loss. For example, the thickness of the MTJ hard masks 222(1)-222(M) formed over the MTJs 206(1)-206(M) of the MRAM array 202 in FIGS. 2A and 2B can be reduced to be less than fifty-five nanometers (55 nm), as a non-limiting example, because reactive ion etching (RIE) processes used to provide desired sidewall verticality and open-circuit separation between the MTJs 206(1)-206(M) can be performed for less time. Similarly, the time spent performing angled ion beam etching (IBE) processes used for over-etching to remove sidewall re-deposition and/or damage caused by RIE processes can also be reduced. Although not shown in FIGS. 2A and 2B, the MTJ sidewalls 224(1)-224(M) may be sloped to have a sidewall angle less than ninety (90) degrees, such as between sixty (60) degrees and eighty (80) degrees, due to such etching processes. In examples discussed herein, a sidewall angle of an MTJ is the angle between a given sidewall of the MTJ and a surface upon which the MTJ is formed.

Further, by reducing the etching depth for forming the individual MTJs 206(1)(1)-206(M)(N) in the MRAM array 202, a height $H_{SW}$ of an area of each MTJ sidewall 224(1)-224(M) exposed to a respective cell separation area 228(1)(1)-228(M-1)(N-1) is also reduced, thereby reducing the lateral projections of the MTJ sidewalls 224(1)-224(M). For example, as illustrated in FIGS. 2A and 2B, since the first MTJ 206(1)(1) and the second MTJ 206(1)(2) of the first row 208(1) of MTJs (206)(1)(1)-206(1)(N) may be formed by etching the cell separation area 228(1)(1) to the top surface of the first common pinned layer 216(1), the etching depth for forming the first MTJ 206(1)(1) and the second MTJ 206(1)(2) of the first row 208(1) of MTJs (206)(1)(1)-206(1)(N) is reduced by an amount approximately equal to the sum of the height $H_{BE}$ of the first common bottom electrode 212(1) and the height $H_{PL}$ of the first common pinned layer 216(1). Since the etching depth of the cell separation area 228(1)(1) is reduced by this amount, the height $H_{SW}$ of the area of the first MTJ sidewall 224(1) exposed to the cell separation area 228(1)(1) is reduced to a height extending from the top surface of the first common pinned layer 216(1) to the top surface of the first MTJ hard mask 222(1), rather than extending from at least below the bottom surface of the first common bottom electrode 212(1) to the top surface of the first MTJ hard mask 222(1). By reducing the height $H_{SW}$ of the area of the first MTJ sidewall 224(1) exposed to the cell separation area 228(1)(1), the lateral projection of the first MTJ sidewall 224(1) extending into the cell separation area 228(1)(1) is also reduced. Such sidewall lateral projections can be further reduced by using thinner MTJ hard masks 222(1)-222(M), such as the MTJ hard masks 222(1)-222(M) illustrated in FIGS. 2A and 2B. This is because a thinner MTJ hard mask 222(1)-222(M) further reduces the height $H_{SW}$ of the area of each MTJ sidewall 224(1)-224(M) exposed to a cell separation area 228(1)(1)-228(M-1)(N-1).

By reducing lateral projections of the MTJ sidewalls 224(1)-224(M) extending into the cell separation areas 228(1)(1)-228(M-1)(N-1), the minimum distance between adjacent MTJs 206( )(1)-206( )(N) of a given row 208(1)-208(M) can be increased. Since an increased minimum distance between adjacent MTJs 206( )(1)-206( )(N) of a given row 208(1)-208(M) can reduce re-deposition and electrical shorts caused by over-etching and/or a small over-etching angle, and can allow for greater use of larger over-etching angles to provide finer control during over-etching, over-etching margin can also be increased. Alternatively, since over-etching margin and the minimum distance between adjacent MTJs 206( )(1)-206( )(N) of a given row 208(1)-208(M) are inversely related, over-etching margin can be maintained and/or slightly increased while MTJs 206( )(1)-206( )(N) of a given row 208(1)-208(M) are placed closer together. For example, by reducing the lateral projection of the first MTJ sidewall 224(1) extending into the cell separation area 228(1)(1) by reducing the height $H_{SW}$ of the area of the first MTJ sidewall 224(1) exposed to the cell separation area 228(1)(1), the first MTJ 206(1)(1) of the first row 208(1) of MTJs 206(1)(1)-206(1)(N) can be fabricated closer to the second MTJ 206(1)(2) of the first row 208(1) of MTJs 206(1)(1)-206(1)(N) along its longitudinal axis $A_1$ while maintaining approximately the same minimum distance between the first MTJ 206(1)(1) and the second MTJ 206(1)(2). In this manner, a desired over-etching margin can be maintained and/or slightly increased while placing the first MTJ 206(1)(1) and the second MTJ 206(1)(2) closer together. In fabricating the MTJs 2060(1)-2060(N) of each row 208(1)-208(M) closer together in the X-axis direction, reduced MTJ row pitch P can be achieved. In this manner, the MRAM array 202 including the rows 208(1)-208(M) of MTJs 206(1)( )-206(M)( ) having reduced row pitch P shown in FIG. 2A can include more MTJs 206( )(1)-206( )(N) in a given row 208(1)-208(M) of a given length and therefore more MTJs 206(1)(1)-206(M)(N) in a given area of the MRAM array 202. Thus, when implemented in exemplary memory applications, such as in the MRAM 204, greater MRAM bit cell density can be achieved, as discussed in greater detail below.

As mentioned above, the MRAM 204 employing the MRAM array 202 illustrated in FIGS. 2A and 2B can be configured to employ an architecture that supports read and write operations in the rows 208(1)-208(M) of MTJs 206(1)( )-206(M)( ) formed as MRAM bit cells of the MRAM 204, with each row 208(1)-208(M) having a respective common bottom electrode 212(1)-212(M). In this regard, the rows 208(1)-208(M) of MTJs 206(1)( )-206(M)( ) illustrated in FIGS. 2A and 2B are disposed over a semiconductor die layer 230 including an interconnect layer 232 and a metal line layer 234. Each MTJ 206(1)(1)-206(M)(N) is disposed approximately over a respective via of a plurality of vias 236(1)(1)-236(M)(N), wherein each via 236(1)(1)-236(M)(N) is disposed in a dielectric material 238 of the interconnect layer 232. In some aspects, the diameter of each MTJ 206(1)(1)-206(M)(N) may be smaller or larger than the diameter of each respective via 236(1)(1)-236(M)(N). Each via 236(1)(1)-236(M)(N) is disposed over a metal line of a plurality of metal lines 240(1)-240(M), wherein each metal line 240(1)-240(M) is disposed in a dielectric material 242 of the metal line layer 234. In this manner, the vias 236(1)(1)-236(M)(N) of the interconnect layer 232 are organized in respective rows of a plurality of rows 244(1)-244(M). In forming the MRAM array 202 illustrated in FIGS. 2A and 2B, the vias 236(1)(1)-236(M)(N) in the interconnect layer 232 and the metal lines 240(1)-240(M) in the metal line layer 234 can provide electric coupling between the MTJs 206(1)(1)-206(M)(N) of the MRAM array 202 and respective access transistors to form MRAM bit cells of the MRAM array 202.

With regard to forming the MRAM array 202 discussed above, FIG. 3 illustrates an exemplary double-patterning fabrication process 300 that can be employed to fabricate the rows 208(1)-208(M) of MTJs 206(1)( )-206(M)( ) in the MRAM array 202 in the semiconductor die 200 in FIGS. 2A and 2B. FIGS. 4A-9B illustrate various exemplary fabrication stages of the exemplary double-patterning fabrication process 300 employed for fabricating the individual MTJs 206(1)(1)-206(M)(N) in the semiconductor die 200 in FIGS. 2A and 2B to form MRAM bit cells to fabricate the MRAM array 202. The exemplary double-patterning fabrication process 300 in FIG. 3 will be discussed in conjunction with the exemplary process stages illustrated in FIGS. 4A-9B.

Figure 3:
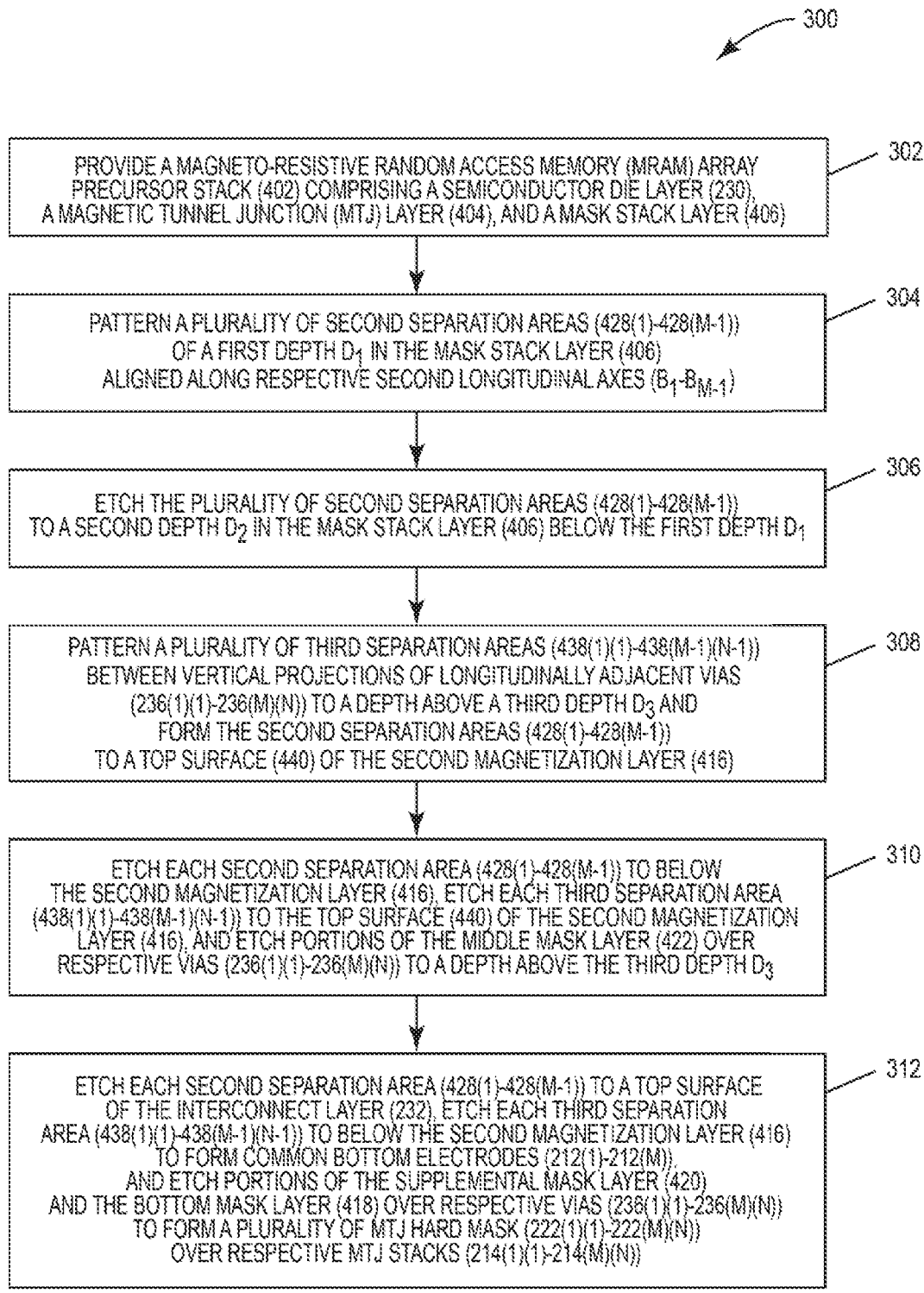
FIG. 3 is a flowchart illustrating an exemplary process of fabricating the MTJs in the double-patterned MRAM array in FIGS. 2A and 2B.
Figure 4A:
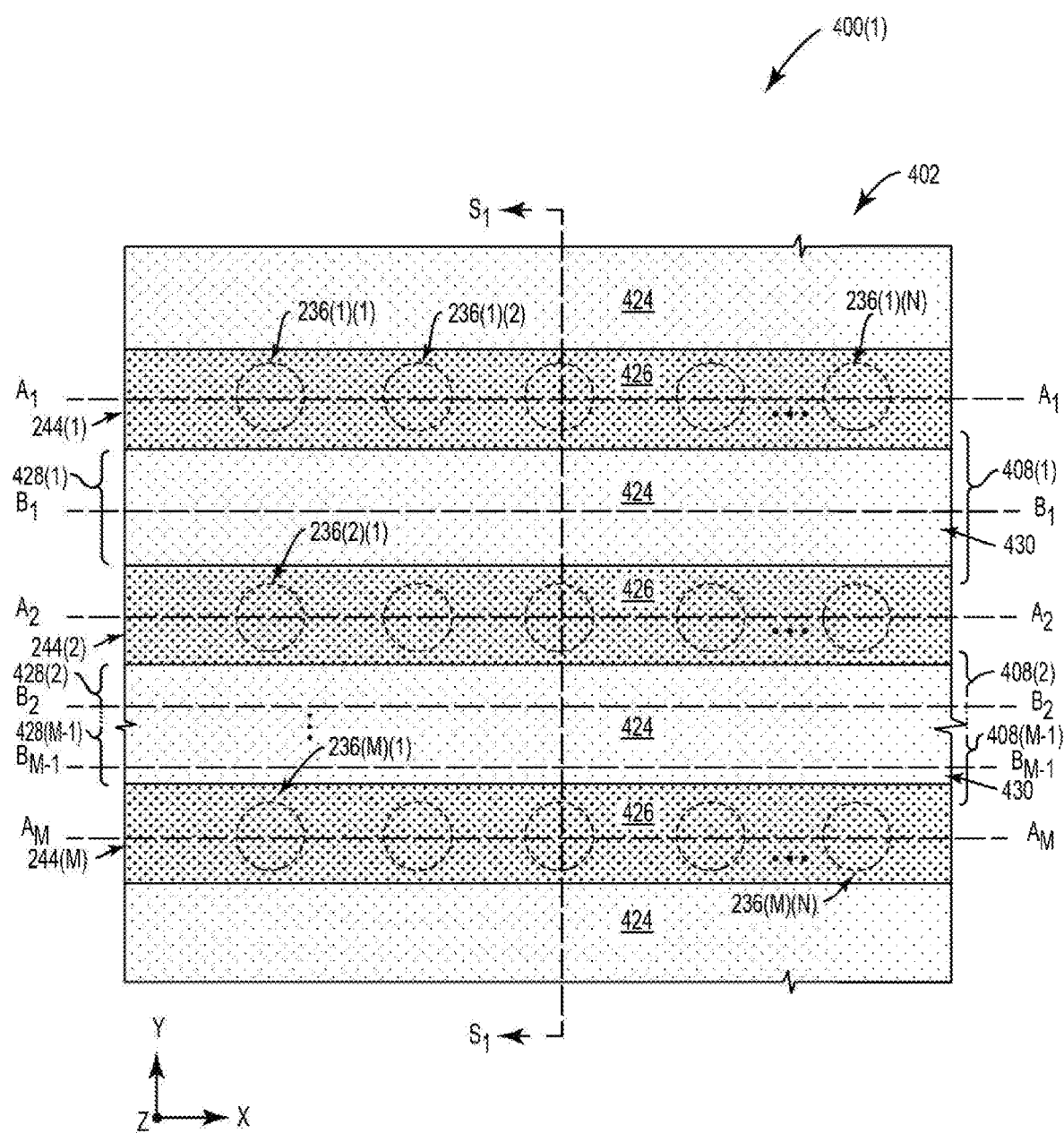
FIGS. 4A and 4B are top-view and cross-sectional, side-view diagrams, respectively, illustrating an exemplary process stage of an MRAM array precursor stack during an exemplary patterning process step of patterning a plurality of second separation areas in a mask stack layer of the MRAM array precursor stack according to the exemplary fabrication process in FIG. 3.
Figure 4B:
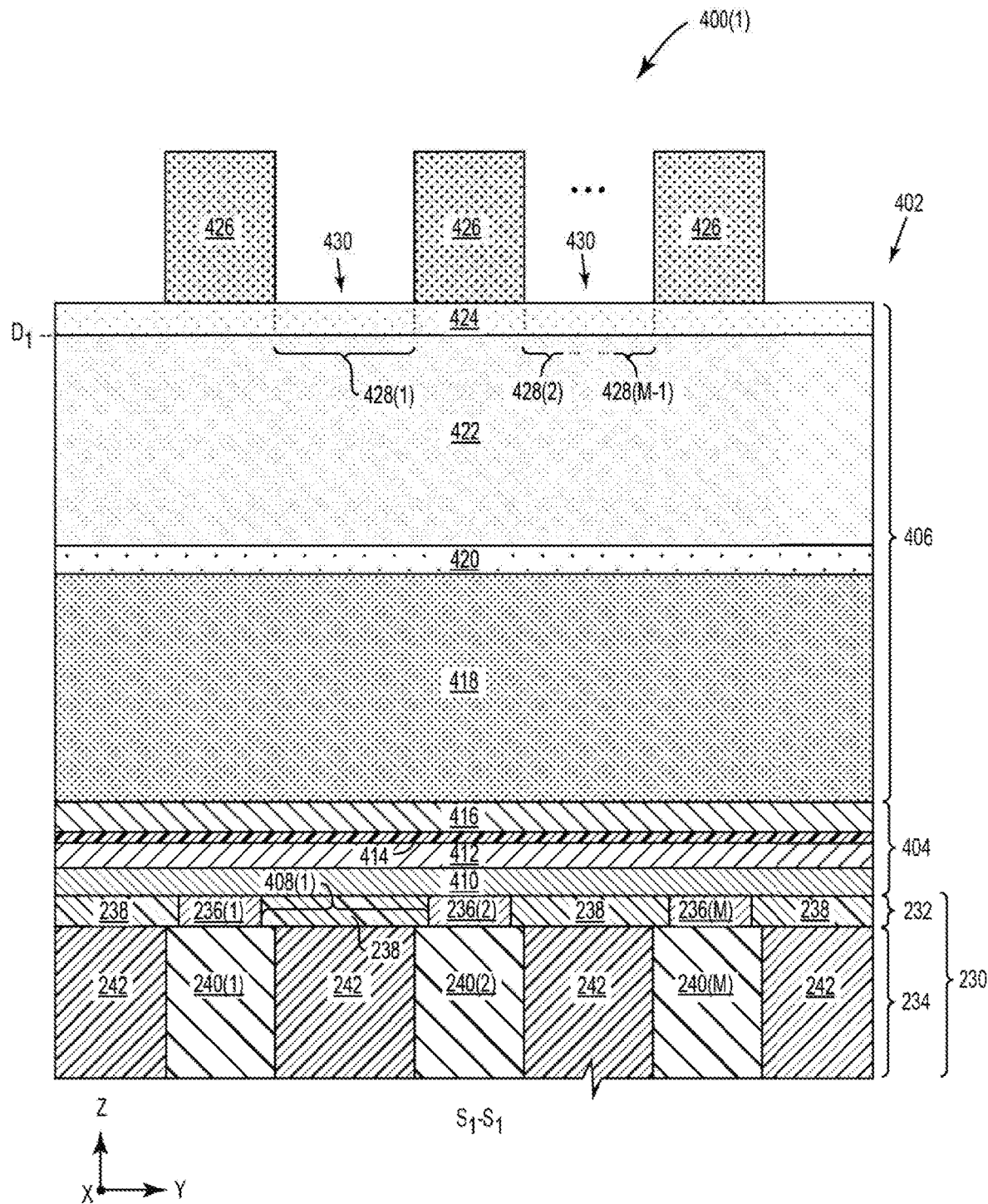

In this regard, a first step of the double-patterning fabrication process 300 in FIG. 3 to fabricate the rows 208(1)-208(M) of MTJs 206(1)( )-206(M)( ) in the MRAM array 202 in the semiconductor die 200 in FIGS. 2A and 2B includes providing an MRAM array precursor stack 402 comprising the semiconductor die layer 230, an MTJ layer 404, and a mask stack layer 406 (block 302 in FIG. 3). The purpose of this step is to provide the desired structure of the MRAM array precursor stack 402 so the rows 208(1)-208(M) of MTJs 206(1)( )-206(M)( ) in the MRAM array 202 in the semiconductor die 200 in FIGS. 2A and 2B can be formed from the MRAM array precursor stack 402 using double-patterning. In this regard, while FIGS. 4A and 4B illustrate a top-view and a cross-sectional, side-view along the cross-section $S_1$-$S_1$, respectively, of a first fabrication stage 400(1) corresponding to a second step of the double-patterning fabrication process 300 in FIG. 3 discussed in further detail below, FIGS. 4A and 4B are also used here to discuss the structure of the MRAM array precursor stack 402 provided in the first step of the double-patterning fabrication process 300. In this manner, the double-patterned MRAM array 202 illustrated in FIGS. 2A and 2B can be formed from the MRAM array precursor stack 402.

As shown in FIGS. 4A and 4B, the MRAM array precursor stack 402, as provided in the first step of the double-patterning fabrication process 300, includes the semiconductor die layer 230 as described above with respect to FIGS. 2A and 2B. As illustrated in FIG. 4A, the location of each via 236(1)(1)-236(M)(N) in the X-Y plane of the MRAM array precursor stack 402 is indicated in FIG. 4A by a dashed-line circle. In this regard, each via 236(1)(1)-236(M)(N) of the MRAM array precursor stack 402 is disposed along a respective first longitudinal axis $A_1$-$A_M$ that is parallel to the other first longitudinal axes $A_1$-$A_M$ in the X-axis direction as shown. Each via 236(1)(1)-236(M)(N) is separated in the Y-axis direction by a respective first separation area of a plurality of first separation areas 408(1)-408(M-1) along respective second longitudinal axes $B_1$-$B_{M-1}$ that are parallel or substantially parallel to each other in the X-axis direction.

The MRAM array precursor stack 402 as provided in the first fabrication stage 400(1) of the double-patterning fabrication process 300 also includes the MTJ layer 404 disposed over the semiconductor die layer 230. As illustrated in FIGS. 4A and 4B, the MTJ layer 404 includes a bottom electrode layer 410, a first magnetization layer 412 above the bottom electrode layer 410, a tunnel barrier layer 414 above the first magnetization layer 412, and a second magnetization layer 416 above the tunnel barrier layer 414. As discussed in further detail below, the rows 208(1)-208(M) of MTJs 206(1)( )-206(M)( ) of the MRAM array 202 illustrated in FIGS. 2A and 2B are formed from the MTJ layer 404 in this example. The MRAM array precursor stack 402 as provided in the first fabrication stage 400(1) of the double-patterning fabrication process 300 also includes the mask stack layer 406 of the MRAM array precursor stack 402. As illustrated in FIGS. 4A and 4B, the mask stack layer 406 is disposed over the MTJ layer 404. In this example, the mask stack layer 406, as illustrated in FIG. 4B, includes, in ascending order, a bottom mask layer 418 (e.g., a hard mask layer), a supplemental mask layer 420, a middle mask layer 422, and a top mask layer 424. In this manner, the mask stack layer 406 enables double patterning of the MRAM array precursor stack 402 to form the rows 208(1)-208(M) of MTJs 206(1)( )-206(M)( ) of the MRAM array 202 illustrated in FIGS. 2A and 2B.

In aspects disclosed herein, providing the MRAM array precursor stack 402 can include fabricating the MRAM array precursor stack 402 in whole or in part and/or receiving the MRAM array precursor stack 402 by other means, including receiving the semiconductor die 200 with the MRAM array precursor stack 402 formed thereon as fabricated and sourced from another party. Aspects of the semiconductor die layer 230 can be provided by processes such as chemical vapor deposition (CVD), physical vapor deposition (PVD), photolithography, RIE, IBE, chemical mechanical planarization (CMP), wet/dry cleaning processes, MTJ annealing, encapsulation sidewall processes, and/or etchback processes, as non-limiting examples. The semiconductor die layer 230 can comprise materials such as silicon (Si), silicon oxide (SiO), a high-k oxide material, a metal gate material, boron (B), phosphorous (P), arsenic (As), titanium (Ti), cobalt (Co), nickel (Ni), silicon germanium (SiGe), tungsten (W), copper (Cu), silicon nitrogen (SiN), silicon oxygen nitrogen (SiON), and/or silicon carbon nitrogen (SiCN), as non-limiting examples. Each via 236(1)(1)-236(M)(N) in the interconnect layer 232 of the semiconductor die layer 230 can have a diameter such as approximately 5 nm, approximately 10 nm, and/or approximately 22 nm, as non-limiting examples, and can be separated from one another in the Y-axis direction by a first separation area 408(1)-408(M-1) having a length such as approximately 15.5 nm, approximately 17.5 nm, and/or between approximately 23-30 nm, as non-limiting examples.

The bottom electrode layer 410 can comprise materials including tantalum (Ta), tantalum nitride (TaN), W, Cu, ruthenium (Ru), Ti, TiN, platinum manganese (PtMn), platinum (Pt), Co, and/or platinum cobalt (PtCo), as non-limiting examples, and can have a thickness between approximately 10-20 nm, approximately 10 nm, 15 nm, 18 nm, and/or 20 nm, as non-limiting examples. The bottom electrode layer 410 can be formed using processes such as PVD, CVD, plating, and/or sputtering, as non-limiting examples. The first magnetization layer 412 can comprise materials such as Co/Pt, Co/Iridium (Ir)/Co, chromium (Cr), Ir, WCoFeB, and/or iron boron (FeB), and can have a thickness of approximately 7 nm, 10 nm, and/or 15 nm, as non-limiting examples. The first magnetization layer 412 can be formed using processes such as PVD and/or sputtering, as non-limiting examples. The tunnel barrier layer 414 can comprise materials such as MgO and/or Mg, and can have a thickness of approximately 0.8 nm, 0.9 nm, and/or 1 nm, as non-limiting examples. The tunnel barrier layer 414 can be formed using processes such as RF—MgO and/or Mg nature oxidation, as non-limiting examples. The second magnetization layer 416 can comprise materials such as CoFeB, Mg/Ta, RF—MgO, MgO, Mg/Ta, Ru, and/or CoFeB, and can have a thickness of approximately 3 nm, 3.5 nm, and/or 4 nm, as non-limiting examples. The second magnetization layer 416 can be formed using processes such as PVD and/or sputtering, as non-limiting examples.

The bottom mask layer 418 can comprise materials including TiN, Ti, TaN, Ta, and/or W, as non-limiting examples, and can have a thickness of approximately 10 nm, 15 nm, and/or 20 nm, as non-limiting examples. The bottom mask layer 418 can be formed using processes such as PVD and/or sputtering, as non-limiting examples. The supplemental mask layer 420 can comprise materials including Ru, as a non-limiting example, and can have a thickness between approximately 10-20 nm, approximately 5-10 nm, and/or approximately 15-25 nm, as non-limiting examples. The supplemental mask layer 420 can be formed using processes such as PVD and/or sputtering, as non-limiting examples. The middle mask layer 422 can comprise materials including spin-on carbon (SoC) and/or spin-on glass (SoG), as non-limiting examples, and can have a thickness between approximately 80-85 nm, approximately 70-80 nm, and/or approximately 85-90 nm, as non-limiting examples. The middle mask layer 422 can be formed using processes such as CVD and/or PVD, as non-limiting examples. The top mask layer 424 can comprise materials including Co, cobalt iron (CoFe), nickel iron (NiFe), and/or CoFeB, as non-limiting examples, and can have a thickness between approximately 2-3 nm, as non-limiting examples. The top mask layer 424 can be formed using processes such as PVD, CVD, and/or sputtering, as non-limiting examples.

Once the MRAM array precursor stack 402 is fabricated, a first photoresist pattern 426 can be formed on a top surface of the MRAM array precursor stack 402 during a first patterning step in the double-patterning fabrication process 300 in FIG. 3. In this manner, a plurality of row separation areas can be formed in the semiconductor die 200 to be processed in a later step to enable the rows 208(1)-208(M) of MTJs 206(1)( )-206(M)( ) in the MRAM array 202 to each have a common bottom electrode 212(1)-212(M). In this regard, a second step of the double-patterning fabrication process 300 in FIG. 3 includes patterning a plurality of second separation areas 428(1)-428(M-1) of a first depth $D_1$ in the mask stack layer 406 aligned along respective second longitudinal axes $B_1$-$B_{M-1}$ that are parallel or substantially parallel to each other in the X-axis direction (block 304 in FIG. 3). FIGS. 4A and 4B illustrate a top-view and a cross-sectional, side-view, respectively, of the first fabrication stage 400(1) of forming the first photoresist pattern 426 over the mask stack layer 406 of the MRAM array precursor stack 402 to enable etching to form the second separation areas 428(1)-428(M-1) to a first depth $D_1$ according to the fabrication step in block 304 in FIG. 3. In this example, although not shown in FIGS. 4A and 4B, the first photoresist pattern 426 is formed by initially depositing a first photoresist layer over the mask stack layer 406. Portions of the first photoresist layer along respective second longitudinal axes $B_1$-$B_{M-1}$ disposed parallel or substantially parallel to each other in the X-axis direction in this example are then exposed to deep ultraviolet (DUV) and/or extreme UV (EUV) light to make the exposed portions soluble to a first photoresist developer. The first photoresist developer is then used to remove the exposed portions of the first photoresist layer to form the first photoresist pattern 426, as illustrated in FIGS. 4A and 4B. In this manner, the first photoresist pattern 426 exposes and protects alternating longitudinal portions of a top surface of the top mask layer 424.

Figure 5A:
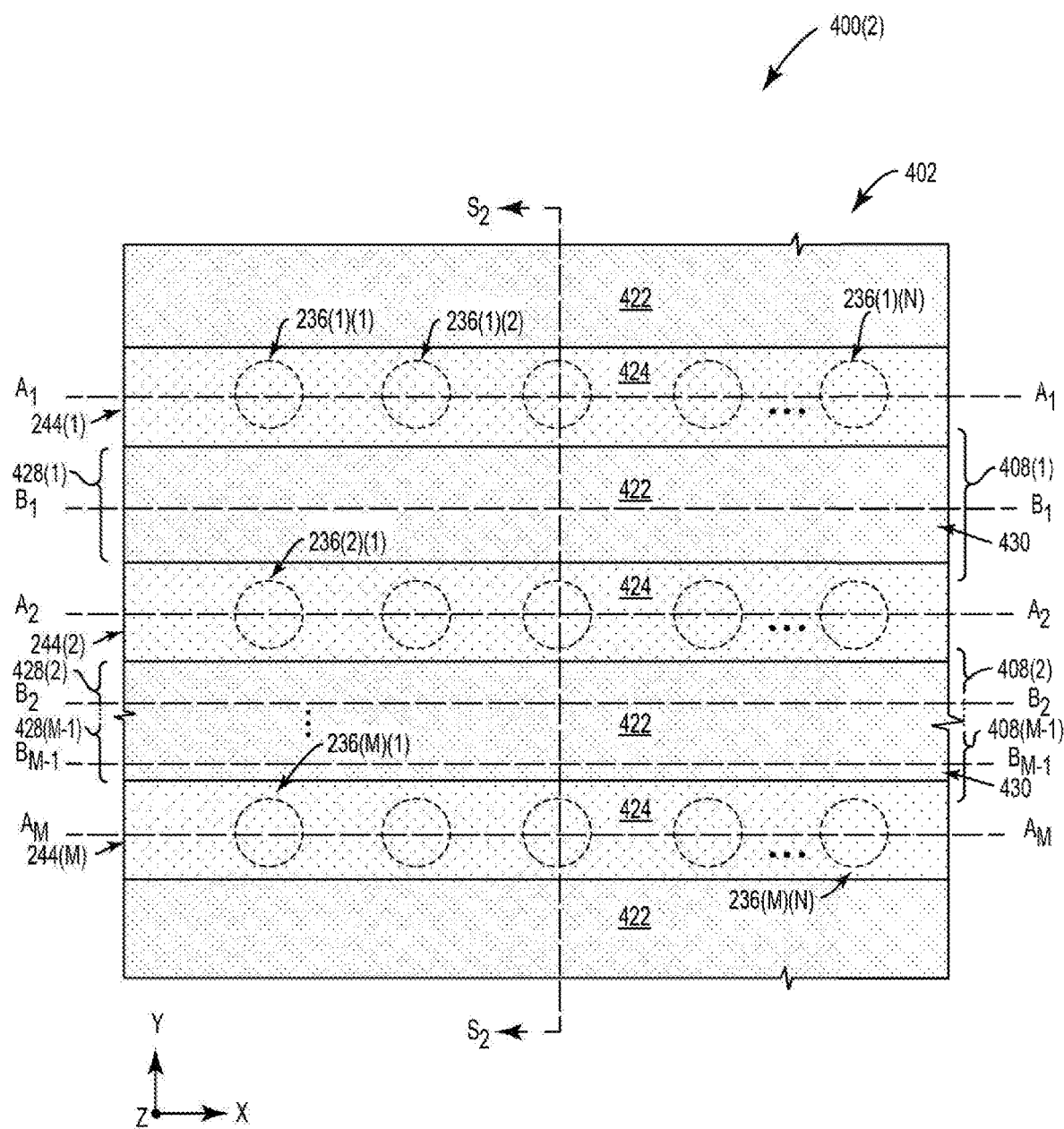
FIGS. 5A and 5B are top-view and cross-sectional, side-view diagrams, respectively, illustrating an exemplary process stage of the MRAM array precursor stack after the exemplary process step shown in FIGS. 4A and 4B has been performed.
Figure 5B:
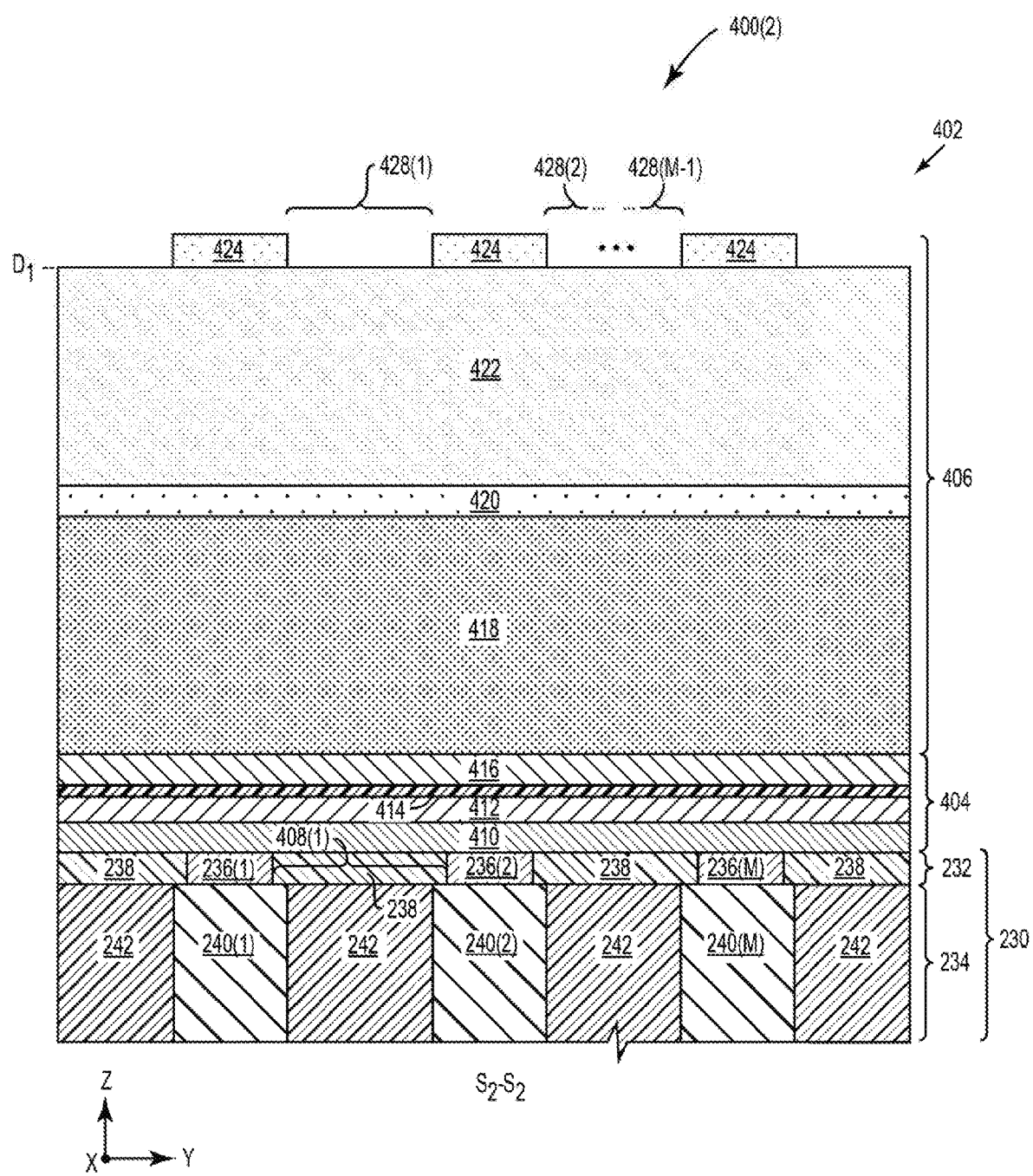

The plurality of exposed portions 430 of the top mask layer 424 defined by the first photoresist pattern 426 are then etched to the first depth $D_1$ in the mask stack layer 406 to form the second separation areas 428(1)-428(M-1) (shown in FIGS. 5A and 5B). In this example, the exposed portions 430 of the top mask layer 424 are etched using RIE, while the portions of the top mask layer 424 below the first photoresist pattern 426 are protected from etching. Once etched, the second separation areas 428(1)-428(M-1) extend to the first depth $D_1$ in the mask stack layer 406 and expose portions of a top surface of the middle mask layer 422 (as shown in FIGS. 5A and 5B). After the second separation areas 428(1)-428(M-1) are formed to the first depth $D_1$, the first photoresist pattern 426 is removed. In this regard, FIGS. 5A and 5B illustrate a top-view and a cross-sectional, side-view along the cross-section $S_2$-$S_2$, respectively, of the MRAM array precursor stack 402 at a second fabrication stage 400(2) after the exemplary first patterning step illustrated in FIGS. 4A and 4B.

In aspects disclosed herein, the first photoresist pattern 426 can comprise materials including Co, CoFe, NiFe, and/or CoFeB, as non-limiting examples, and can have a thickness approximately 2 nm, 3 nm, and/or approximately 2-3 nm, as non-limiting examples. The first photoresist pattern 426 can be formed using processes such as EUV lithography and/or DUV, as non-limiting examples. In aspects disclosed herein, EUV light includes light having a wavelength approximately 13.5 nm, as a non-limiting example. The first photoresist developer can include solutions such as Tetramethylammonium Hydroxide (TMAH) and/or Tetrabutylammonium Hydroxide (TBAH), as non-limiting examples. In the patterning process discussed above with regard to FIGS. 4A and 4B, RIE can include using etchants such as carbon monoxide (CO)/, ammonia ($NH_3$), and/or methanol ($CH_3OH$), as non-limiting examples, and can be used to achieve etching selectivities such as 15:1 and/or 20:1, as non-limiting examples. In other aspects disclosed herein, etching can also include plasma, CO/NH3, and/or CH3OH, as non-limiting examples.

Figure 6A:
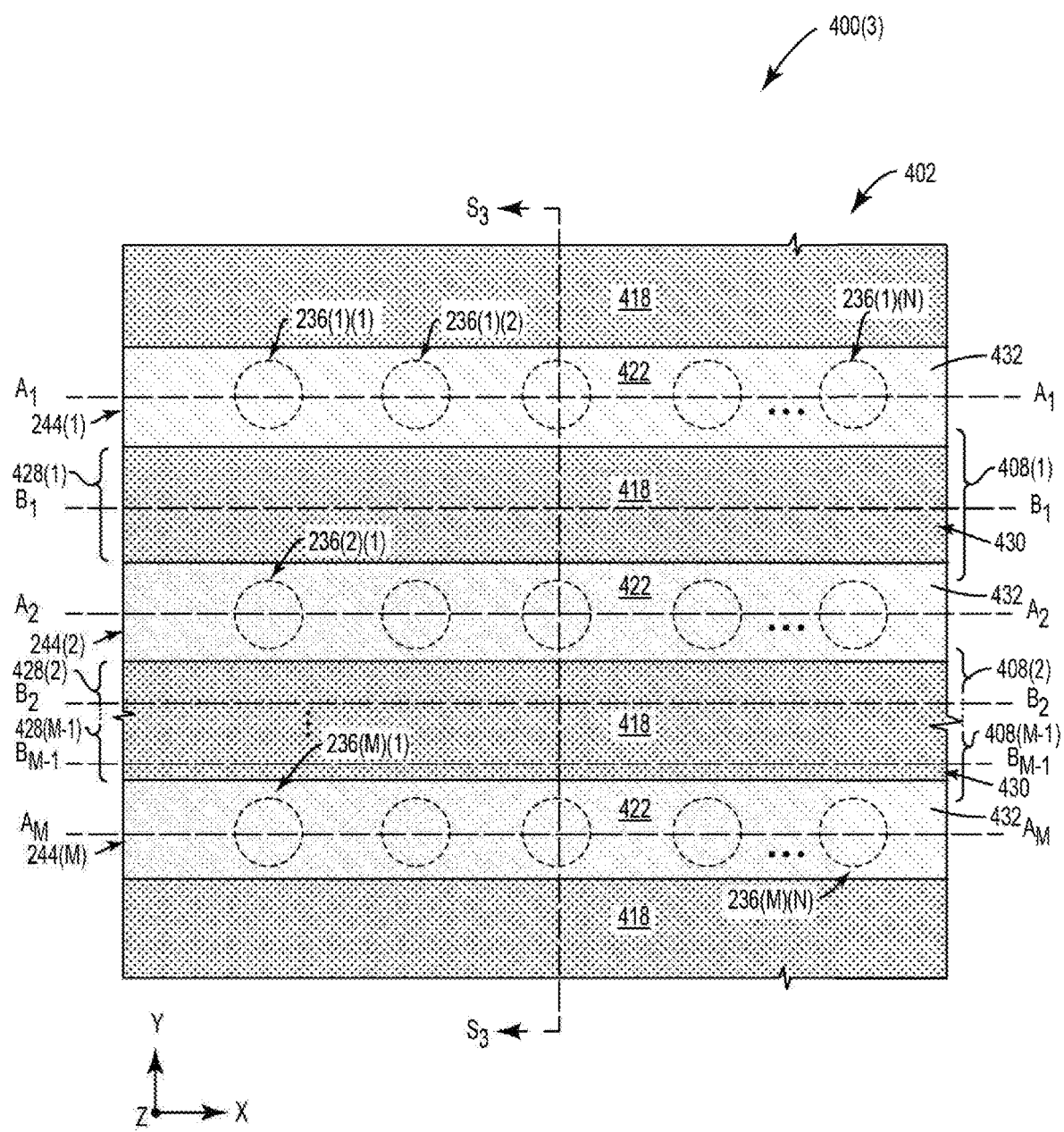
FIGS. 6A and 6B are top-view and cross-sectional, side-view diagrams, respectively, illustrating an exemplary process stage of the MRAM array precursor stack after an exemplary process step of etching the plurality of second separation areas and a top mask layer of the mask stack layer has been performed according to the exemplary fabrication process in FIG. 3.
Figure 6B:
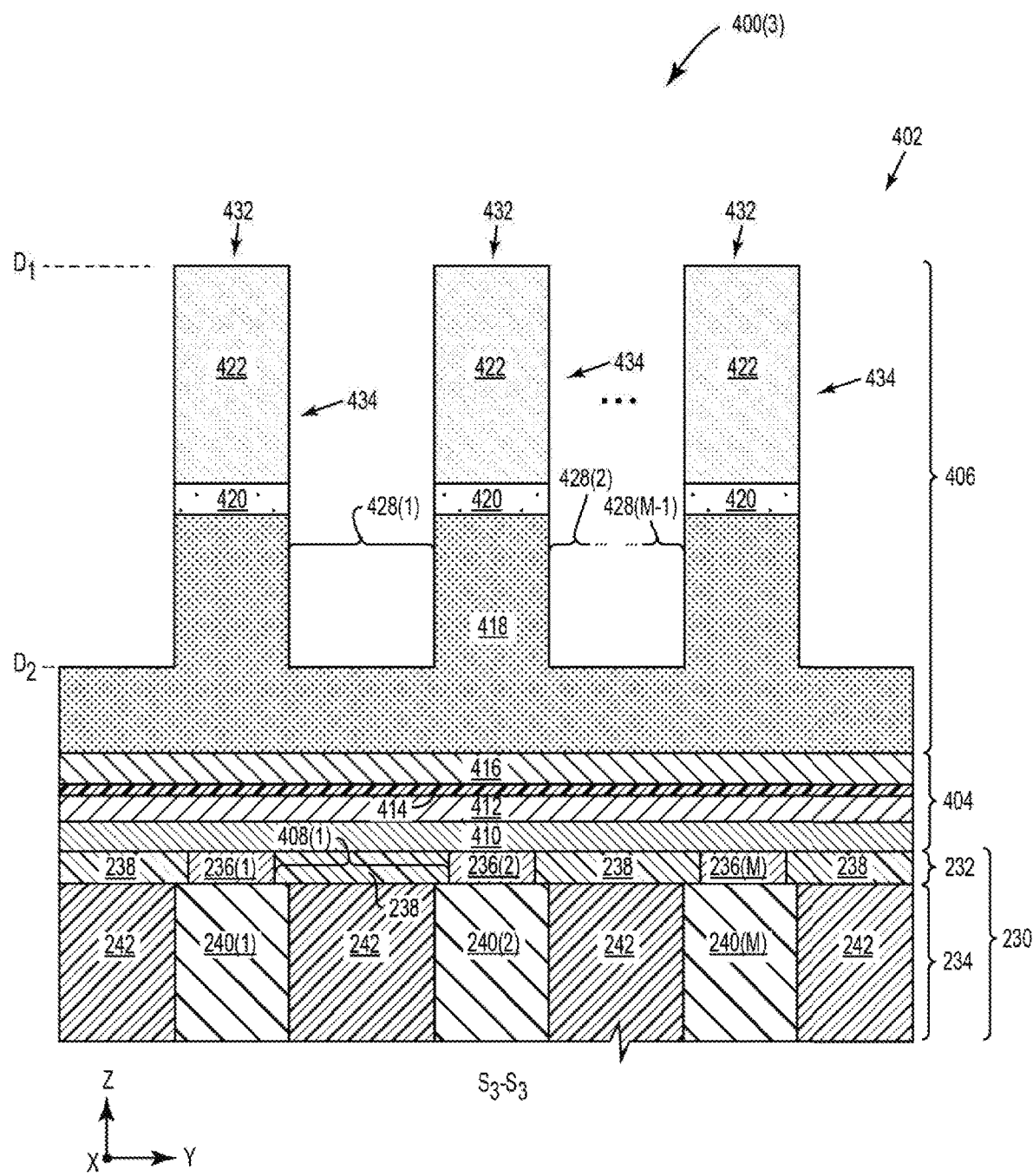

After the first photoresist pattern 426 is removed, the MRAM array precursor stack 402 can be further etched to increase the depth of the second separation areas 428(1)-428(M-1) relative to a processed top surface of the MRAM array precursor stack 402. In this regard, a third step of the double-patterning fabrication process 300 in FIG. 3 includes etching the second separation areas 428(1)-428(M-1) to a second depth $D_2$ in the mask stack layer 406 below the first depth $D_1$ (block 306 in FIG. 3). In this regard, FIGS. 6A and 6B illustrate a top-view and a cross-sectional, side-view along the cross-section $S_3$-$S_3$, respectively, of a third fabrication stage 400(3) of the MRAM array precursor stack 402 after etching the second separation areas 428(1)-428(M-1) to the second depth $D_2$ and etching the top mask layer 424 over each row 244(1)-244(M) of vias 236(1)( )-236(M)( ) according to the fabrication step in block 306 in FIG. 3. In this example, a dry RIE process is used to simultaneously etch the second separation areas 428(1)-428(M-1) to the second depth $D_2$ and the remaining portions of the top mask layer 424 such that portions of the top surface 432 of the middle mask layer 422 are exposed after etching. In etching the second separation areas 428(1)-428(M-1) to the second depth $D_2$, portions of the middle mask layer 422, the supplemental mask layer 420, and the bottom mask layer 418 are removed via etching. In this manner, the dry RIE process in this example increases the difference in depth between the second separation areas 428(1)-428(M-1) and the exposed portions of the top surface 432 of the middle mask layer 422.

Increasing the depth differential during this third step helps to achieve desired heights of components in the fabricated double-patterned MRAM array 202 illustrated in FIGS. 2A and 2B by accounting for differences of etching rates and depth between layers processed in later steps, as discussed in greater detail below. Further, by increasing the depth differential during the third step, the use of particular etching processes, such as RIE or IBE processes, can be limited and/or expanded where desired to help reduce issues and/or provide desired features associated with each etching process. For example, by using a dry RIE process in the third step, sidewalls 434 of each second separation area 428(1)-428(M-1) in this example may have a sidewall angle between approximately eighty-seven (87) and eighty-nine (89) degrees after performing the third step. In this manner, the bottoms of the second separation areas 428(1)-428(M-1) can remain relatively wide after etching, as illustrated in FIGS. 6A and 6B, thereby providing increased over-etch margin for later process steps.

Etching the second separation areas 428(1)-428(M-1) to the second depth $D_2$ and the remaining portions of the top mask layer 424 can include using etching processes such as RIE, as a non-limiting example. Etchants used in the third process step discussed above can include etchants such as tetrafluoromethane ($CF_4$), as a non-limiting example. In additional aspects, the sidewalls 434 of each second separation area 428(1)-428(M-1) include sidewall angles such as 87 degrees and/or 89 degrees, as non-limiting examples.

After the third step is performed, a second photoresist pattern 436 can be formed over each via 236(1)(1)-236(M)

Figure 7A:
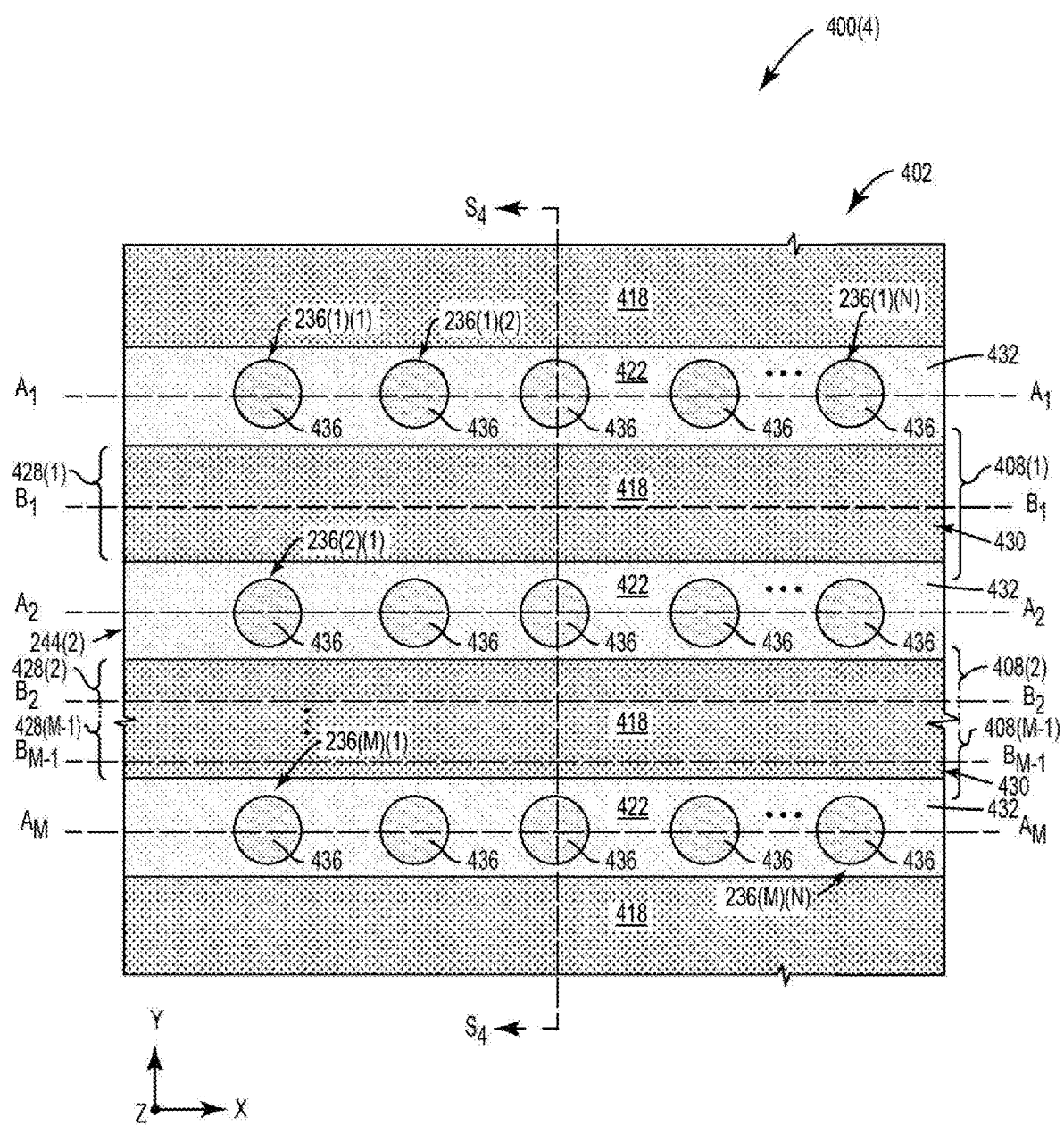
FIGS. 7A and 7B are top-view and cross-sectional, side-view diagrams, respectively, illustrating an exemplary process stage of the MRAM array precursor stack during an exemplary process step of patterning a plurality of third separation areas in the mask stack layer of the MRAM array precursor stack according to the exemplary fabrication process in FIG. 3.
Figure 7B:
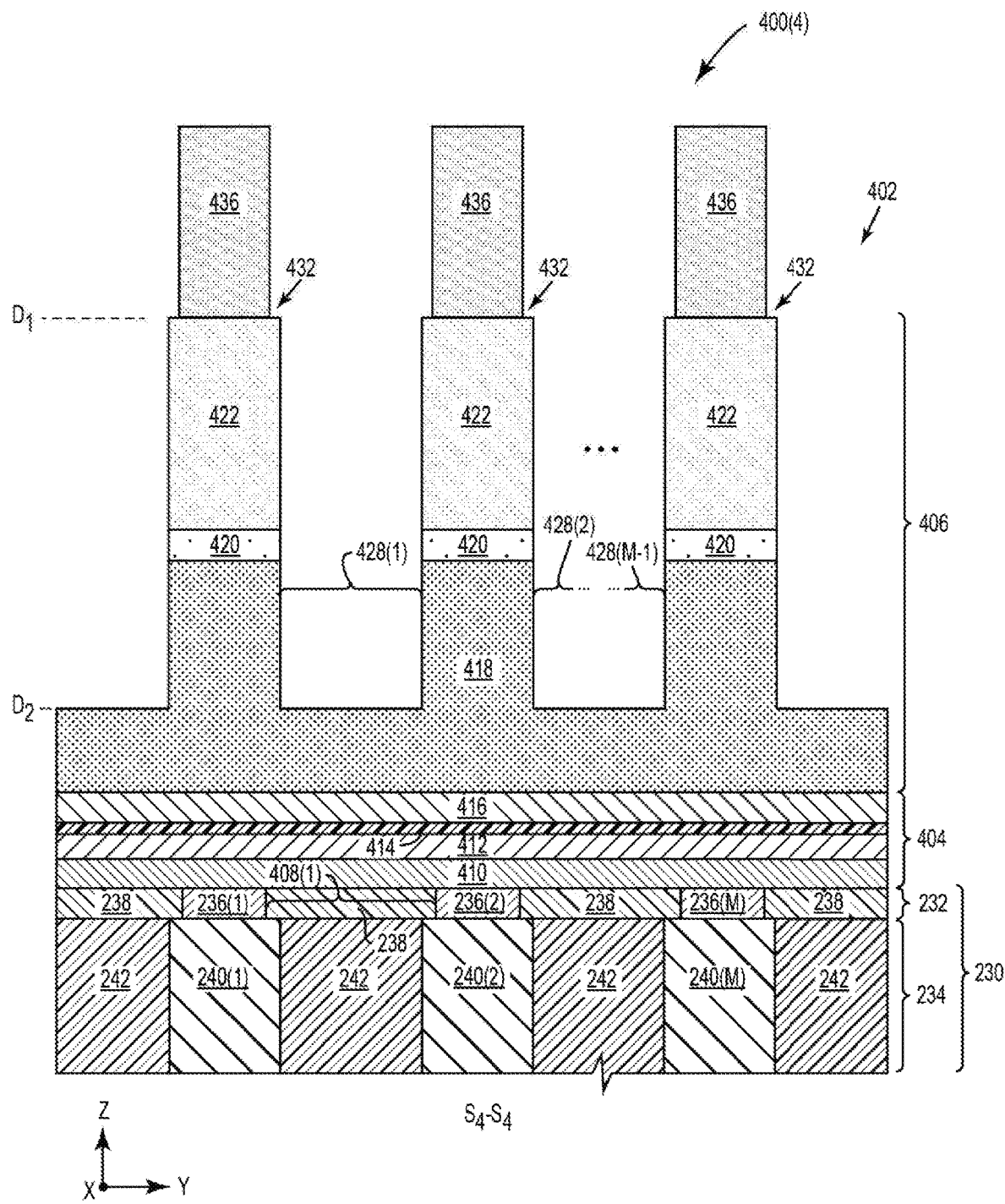

(N) on the exposed portions of the top surface 432 of the middle mask layer 422 during a second patterning step in the double-patterning fabrication process 300 in FIG. 3. In this manner, the cell separation areas 228(1)(1)-228(M-1)(N-1) can be formed in the semiconductor die 200 to be processed in a later step to form the individual MTJs 206(1)(1)-206 (M)(N) in the MRAM array 202. In this regard, a fourth step of the double-patterning fabrication process 300 in FIG. 3 includes patterning a plurality of third separation areas 438(1)(1)-438(M-1)(N-1) between vertical projections of longitudinally adjacent vias 2360(1)-2360(N) to a depth above a third depth $D_3$ and forming the second separation areas 428(1)-428(M-1) to a top surface 440 of the second magnetization layer 416 (block 308 in FIG. 3). FIGS. 7A and 7B illustrate a top-view and a cross-sectional, side-view, along the cross-section $S_4$-$S_4$, respectively, of a fourth fabrication stage 400(4) of forming the second photoresist pattern 436 over the mask stack layer 406 of the MRAM array precursor stack 402. In this manner, the MRAM array precursor stack 402 as illustrated in FIGS. 7A and 7B can be etched to form the third separation areas 438(1)(1)-438(M-1)(N-1) (shown in FIGS. 8A and 8B) to a depth above the third depth $D_3$ and the second separation areas 428(1)-428 (M-1) to the top surface 440 of the second magnetization layer 416 according to the fabrication step in block 308 in FIG. 3.

In this example, although not shown in FIGS. 7A and 7B, the second photoresist pattern 436 is formed by depositing a second photoresist layer over the processed MRAM array precursor stack 402 as illustrated in FIGS. 6A and 6B. Portions of the second photoresist layer not over a via 236(1)(1)-236(M)(N) of the interconnect layer 232 in this example are then exposed to EUV light to make the exposed portions soluble to a second photoresist developer. The second photoresist developer is then used to remove the exposed portions of the second photoresist layer to form the second photoresist pattern 436, as illustrated in FIGS. 7A and 7B. In this manner, the second photoresist pattern 436 is disposed over each via 236(1)(1)-236(M)(N) on portions of the top surface 432 of the middle mask layer 422 to protect portions of the mask stack layer 406 below the second photoresist pattern 436 during etching.

Figure 8A:
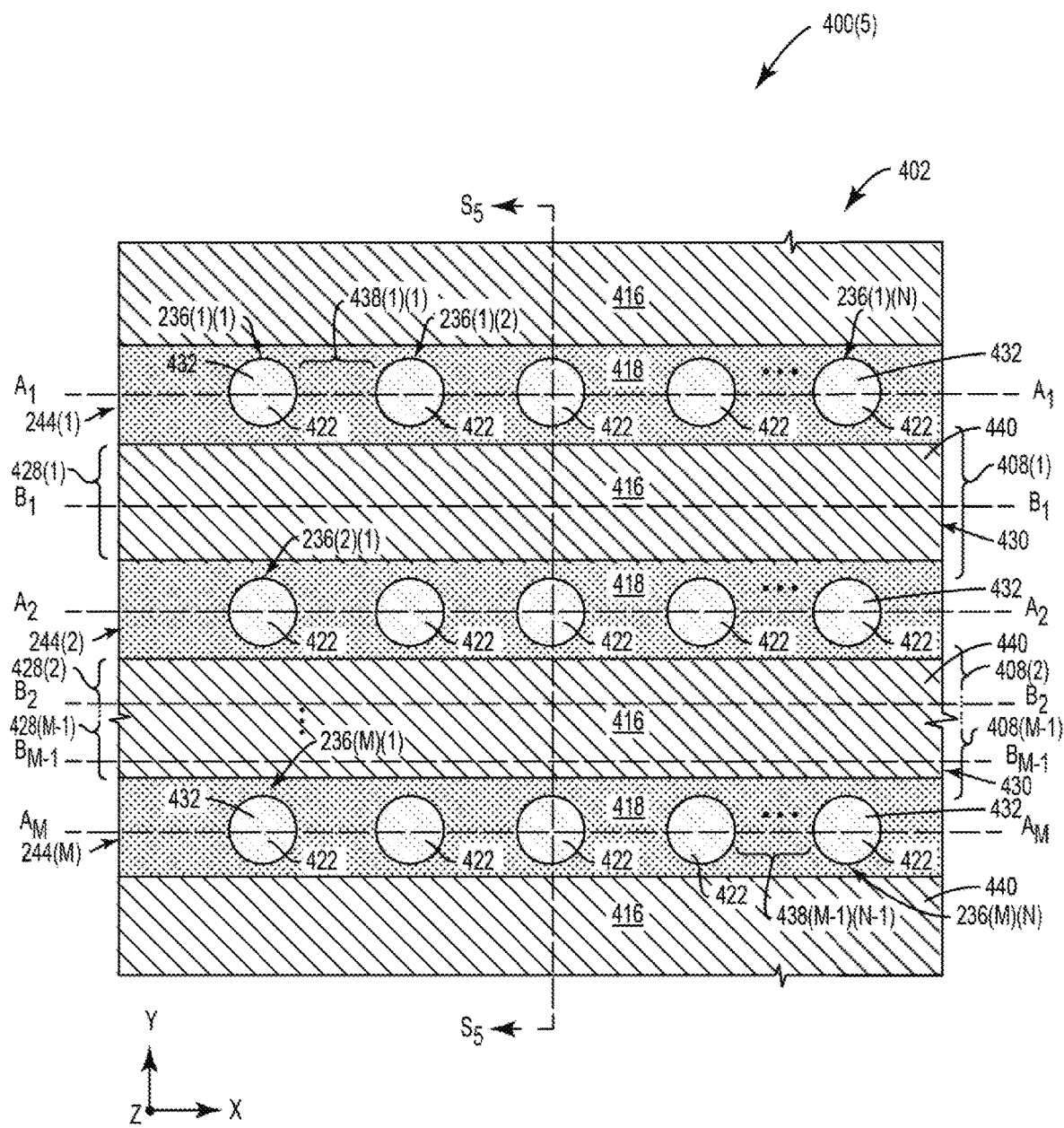
FIGS. 8A and 8B are top-view and cross-sectional, side-view diagrams, respectively, illustrating an exemplary process stage of the MRAM array precursor stack after the process step shown in FIGS. 7A and 7B.
Figure 8B:
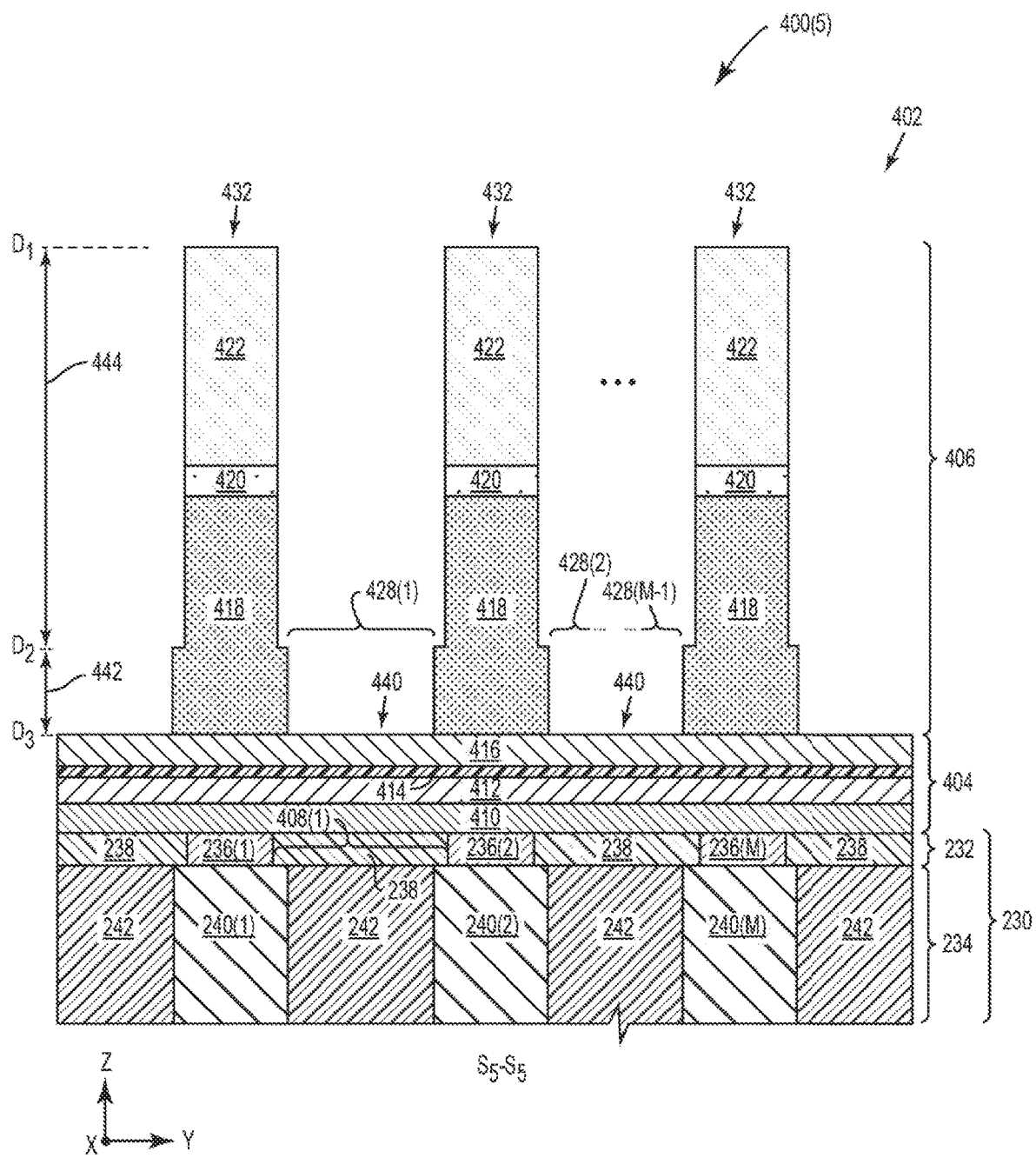

After the second photoresist pattern 436 is formed, the exposed portions of the MRAM array precursor stack 402 defined by the second photoresist pattern 436 as illustrated in FIGS. 7A and 7B are then etched. In this regard, FIGS. 8A and 8B illustrate a top-view and a cross-sectional, side-view along the cross-section $S_5$-$S_5$, respectively, of the MRAM array precursor stack 402 at a fifth fabrication stage 400(5) after the exemplary second patterning step illustrated in FIGS. 7A and 7B. As shown in FIGS. 8A and 8B, the third separation areas 438(1)(1)-438(M-1)(N-1) formed during the second patterning step illustrated in FIGS. 7A and 7B are formed between vertical projections of longitudinally adjacent vias 2360(1)-2360(N) (as indicated by the solid-line circles representing the second photoresist pattern 436) to a depth in the bottom mask layer 418 above the third depth $D_3$. In some aspects, the third separation areas 438(1)(1)-438 (M-1)(N-1) formed during the second patterning step may be formed to a depth in the supplemental mask layer 420 and/or to a depth in the middle mask layer 422. In this example, the third separation areas 438(1)(1)-438(M-1)(N-1) are formed by using a dry RIE process to etch portions of the middle mask layer 422, the supplemental mask layer 420, and the bottom mask layer 418 defined by the second photoresist pattern 436. The second separation areas 428(1)-428(M-1) in this example are simultaneously etched using the same dry RIE process to form the second separation areas 428(1)-428(M-1) to the top surface 440 of the second magnetization layer 416. After the third separation areas 438(1)(1)-438(M-1)(N-1) are formed, the second photoresist pattern 436 is removed.

In this example, since the dry RIE process performed in the second patterning step in the double-patterning fabrication process 300 uses an etchant with a high etching selectivity between the mask stack layer 406 and the MTJ layer 404, such as $CF_4$ or chlorine gas ($Cl_2$), as non-limiting examples, a difference between the depth of the second separation areas 428(1)-428(M-1) and the depth of the third separation areas 438(1)(1)-438(M-1)(N-1) is created. In this regard, at the fifth fabrication stage 400(5) illustrated in FIGS. 8A and 8B, two depth differentials 442 and 444 exist in the MRAM array precursor stack 402. The first depth differential 442 is the difference between the depth of the second separation areas 428(1)-428(M-1) at the third depth $D_3$ in FIG. 8B and the depth of the third separation areas 438(1)(1)-438(M-1)(N-1), and the second depth differential 444 is the difference between the depth of the third separation areas 438(1)(1)-438(M-1)(N-1) and the height at the first depth $D_1$ in FIG. 8B of the portions of the top surface 432 of the middle mask layer 422 below the second photoresist pattern 436.

The first depth differential 442 is desirable because, after being further etched in a subsequent step, the first depth differential 442 can be formed to provide the depth difference between the top surface of each common pinned layer 216(1)-216(M) and the top surface of the interconnect layer 232, as illustrated in FIGS. 2A and 2B. In this regard, the first depth differential 442 enables the reduced etching depth for forming the individual MTJs 206(1)(1)-206(M)(N) in the MRAM array 202 illustrated in FIGS. 2A and 2B and discussed above. The second depth differential 444, on the other hand, is desirable because, after being further etched in a subsequent step, the second depth differential 444 can be etched further to form the depth difference between the top surface of each MTJ hard mask 222(1)(1)-222(M)(N) and the top surface of each common pinned layer 216(1)-216 (M). In other words, the second depth differential 444 is desirable because it can be used to form the cell separation areas 228(1)(1)-228(M-1)(N-1) that allow for the fabrication of the individual MTJs 206(1)(1)-206(M)(N) in the MRAM array 202 illustrated in FIGS. 2A and 2B. Thus, in combination, the first depth differential 442 corresponding to the first patterning step of the double-patterning fabrication process 300 and the second depth differential 444 corresponding to the second patterning step of the double-patterning fabrication process 300 enable reduced etching depth for forming the individual MTJs 206(1)(1)-206(M)(N) in the MRAM array 202 as illustrated in FIGS. 2A and 2B. In this manner, the first and second depth differentials 442 and 444 provided by the exemplary double-patterning fabrication process 300 can reduce etching depth to reduce MTJ sidewall 224(1)-224(M) exposure to the cell separation areas 228(1)(1)-228(M-1)(N-1), thereby reducing lateral projections of the MTJ sidewalls 224(1)-224(M). In reducing MTJ sidewall lateral projections, reduced MTJ row pitch P can be achieved to allow MRAM bit cells having greater MRAM bit cell density to be formed from the MRAM array 202.

Etching the second separation areas 428(1)-428(M-1) and third separation areas 438(1)(1)-438(M-1)(N-1) in the fourth process step of the double-patterning fabrication process 300 can include using etching processes such as RIE, IBE as a non-limiting example. In additional aspects, the sidewalls of each second separation area 428(1)-428(M-1) can have sidewall angles such as 70 degrees, 75 degrees, and/or 80 degrees, as non-limiting examples. In additional aspects, the sidewalls of each third separation area 438(1)(1)-438(M-1)(N-1) can have sidewall angles such as 80 degrees, 85 degrees, and/or 87 degrees, as non-limiting examples.

Figure 9A:
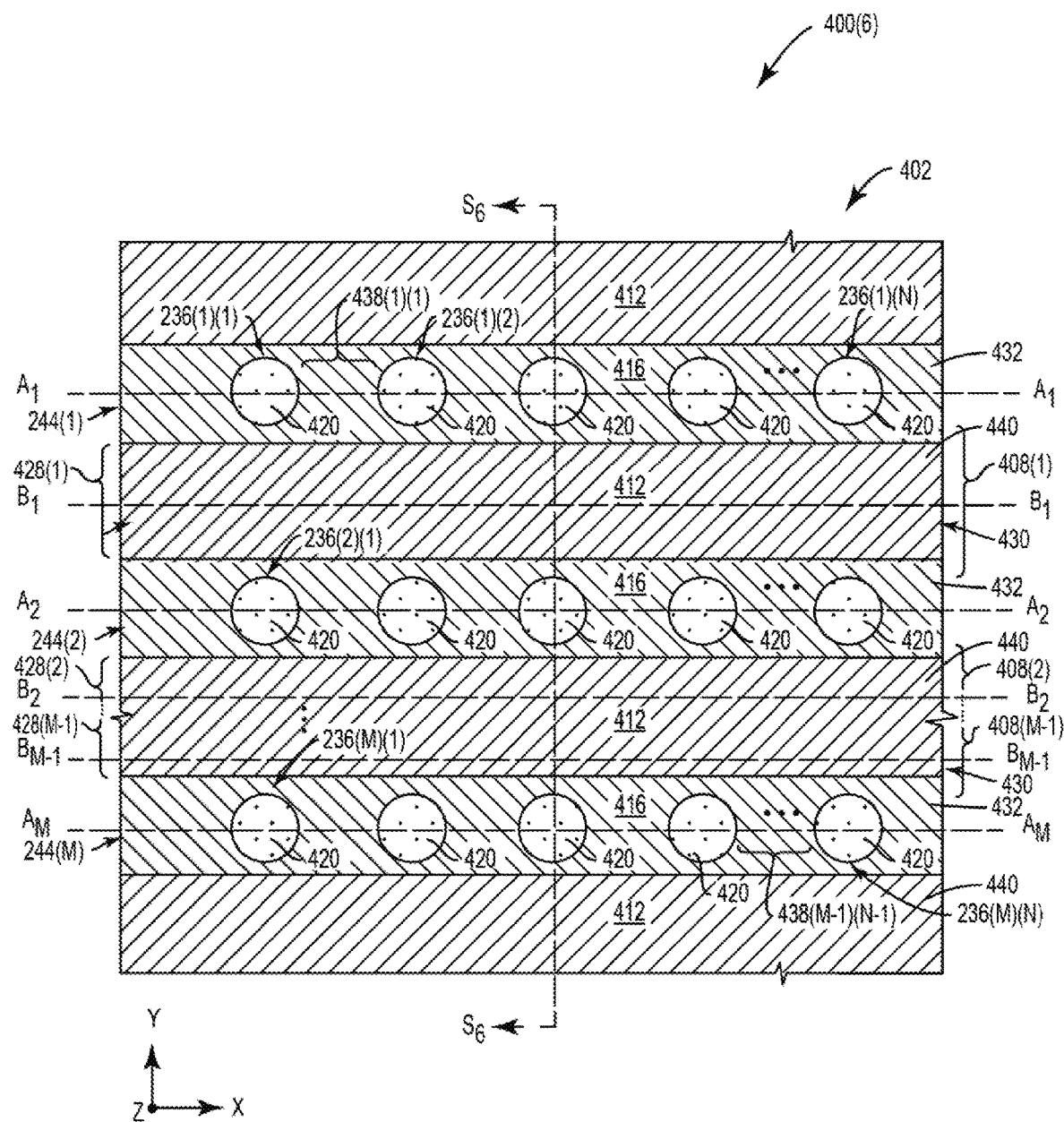
FIGS. 9A and 9B are top-view and cross-sectional, side-view diagrams, respectively, illustrating an exemplary process stage after etching each second separation area, each third separation area, and portions of a middle mask layer in the MRAM array precursor stack has been performed according to the exemplary fabrication process in FIG. 3.
Figure 9B:
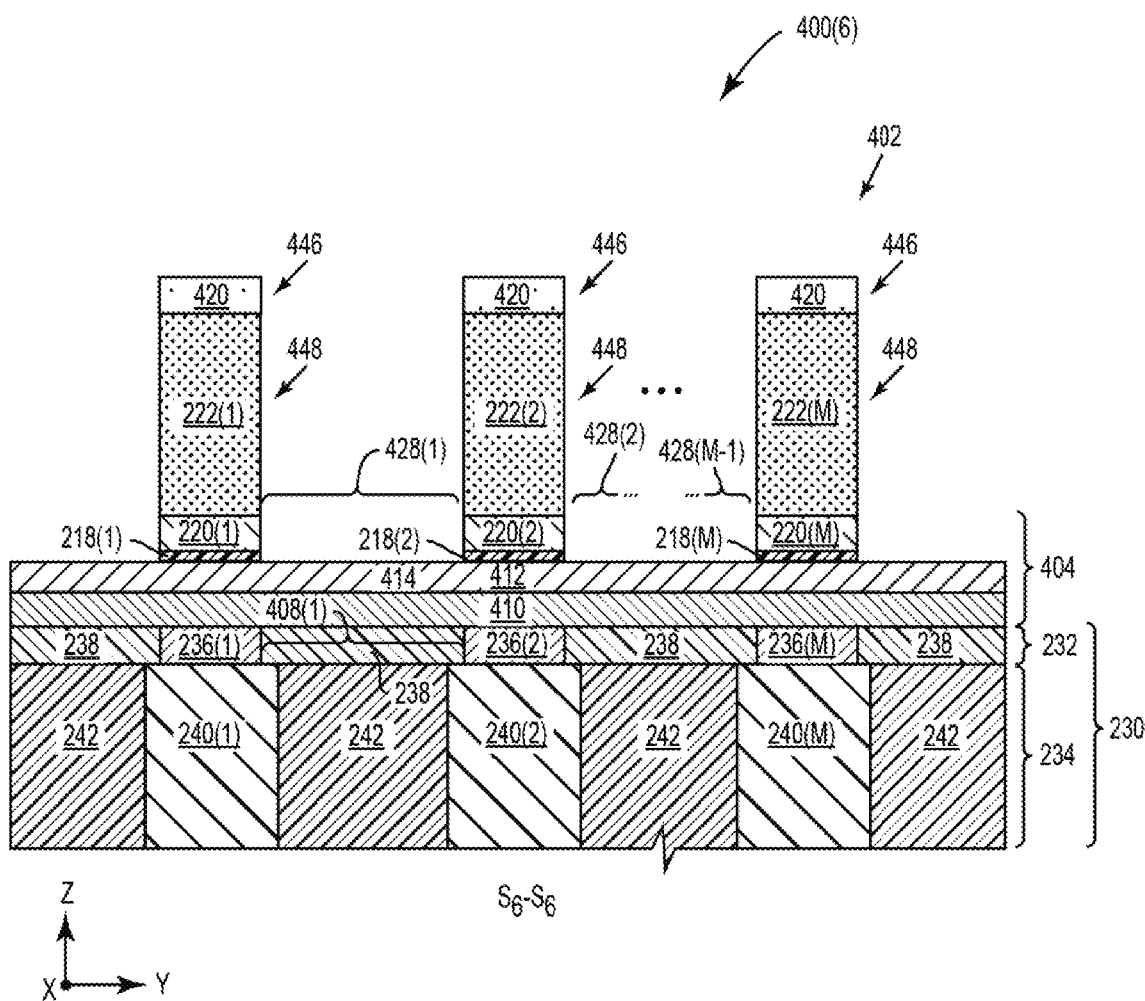

After the second photoresist pattern 436 is removed, the MRAM array precursor stack 402 can be further etched to increase the depth of the second separation areas 428(1)-428(M-1), increase the depth of the third separation areas 438(1)(1)-438(M-1)(N-1), and remove the portions of the top surface 432 of the middle mask layer 422 previously below the second photoresist pattern 436. In this regard, a fifth step of the double-patterning fabrication process 300 in FIG. 3 includes etching each second separation area 428(1)-428(M-1) to below the second magnetization layer 416, etching each third separation area 438(1)(1)-438(M)(N) to the top surface 440 of the second magnetization layer 416, and etching portions of the middle mask layer 422 over respective vias 236(1)(1)-236(M)(N) to a depth above the third depth $D_3$ (block 310 in FIG. 3). In this regard, FIGS. 9A and 9B illustrate a top-view and a cross-sectional, side-view along the cross-section $S_6$-$S_6$, respectively, of a sixth fabrication stage 400(6) of the MRAM array precursor stack 402 after further etching the second separation areas 428(1)-428(M-1), the third separation areas 438(1)(1)-438(M)(N), and portions of the middle mask layer 422 according to the fabrication step in block 310 in FIG. 3.

In this example, an IBE process using small-angle sputtering is used to simultaneously etch the second separation areas 428(1)-428(M-1) to a top surface of the first magnetization layer 412, etch the third separation areas 438(1)(1)-438(M)(N) to the top surface 440 of the second magnetization layer 416, and etch portions of the middle mask layer 422 to a top surface of the supplemental mask layer 420. In etching the second separation areas 428(1)-428(M-1) to the top surface of the first magnetization layer 412, portions of the second magnetization layer 416 and the tunnel barrier layer 414 are removed via etching. In etching the third separation areas 438(1)(1)-438(M)(N) to the top surface 440 of the second magnetization layer 416, portions of the bottom mask layer 418 are removed to form remaining vertical columns 446 of the mask stack layer 406 over the MTJ layer 404. By forming the remaining vertical columns 446 of the mask stack layer 406 over the MTJ layer 404, the individual MTJs 206(1)(1)-206(M)(N) illustrated in FIGS. 2A and 2B can be formed from the MTJ layer 404 in a subsequent process step.

By using an IBE process using small-angle or larger-angle sputtering to further etch the MRAM array precursor stack 402 of the fifth fabrication stage 400(5) illustrated in FIGS. 8A and 8B, differences in depth approximately equal to the first and second depth differentials 442 and 444 can be maintained because such exemplary IBE processes have an approximately one-to-one (1:1) etching selectivity between the various layers of the MRAM array precursor stack 402. However, since such exemplary IBE processes etch at an angle, sidewalls 448 of the remaining vertical columns 446 of the mask stack layer 406 can have increased sidewall angles. For example, by using an IBE process using small-angle sputtering in this example, sidewalls 448 of the remaining vertical columns 446 of the mask stack layer 406 can have a sidewall angle between approximately 60 degrees and 80 degrees after performing the fifth step in the double-patterning fabrication process 300 shown in FIG. 3.

Etching the MRAM array precursor stack 402 in the fifth step of the double-patterning fabrication process 300 can include using etching processes such as RIE and/or IBE, as non-limiting examples. Etchants used in the third process step discussed above can include etchants such as argon (Ar), Helium (He), and/or krypton (Kr), as non-limiting examples. In additional aspects, the sidewalls 448 of the remaining vertical columns 446 of the mask stack layer 406 can include sidewall angles such as 70 degrees, 80 degrees, and/or 87 degrees, as non-limiting examples.

Once the MRAM array precursor stack 402 is etched according to the fifth step of the double-patterning fabrication process 300 shown in FIG. 3, the MRAM array precursor stack 402 can be etched once more to form the individual MTJs 206(1)(1)-206(M)(N) in the MRAM array 202 illustrated in FIGS. 2A and 2B. In this regard, a sixth step of the double-patterning fabrication process 300 in FIG. 3 includes etching each second separation area 428(1)-428(M-1) to a top surface of the interconnect layer 232, etching each third separation area 438(1)(1)-438(M)(N) to below the second magnetization layer 416 to form the common bottom electrodes 212(1)-212(M), and etching portions of the supplemental mask layer 420 and the bottom mask layer 418 over respective vias 236(1)(1)-236(M)(N) to form the MTJ hard masks 222(1)(1)-222(M)(N) over respective MTJ stacks 214(1)(1)-214(M)(N) (block 312 in FIG. 3). In this regard, the rows 208(1)-208(M) of MTJs 206(1)( )-206(M)( ) in the MRAM array 202 in the semiconductor die 200 illustrated in FIGS. 2A and 2B can be fabricated using a double-patterning fabrication process, such as the double-patterning fabrication process 300 shown in FIG. 3.

In this example, an IBE process using small-angle or larger-angle sputtering is used to partially etch the second separation areas 428(1)-428(M-1) to the top surface of the interconnect layer 232 while etching the third separation areas 438(1)(1)-438(M)(N) to a top surface of each common pinned layer 216(1)-216(M) and portions of the supplemental mask layer 420 and the bottom mask layer 418 to a depth in the bottom mask layer 418. In etching the second separation areas 428(1)-428(M-1) to the top surface of the interconnect layer 232, portions of the first magnetization layer 412 and the bottom electrode layer 410 are removed via etching to form each common pinned layer 216(1)-216(M) over each respective common bottom electrode 212(1)-212(M) as illustrated in FIGS. 2A and 2B. In etching the third separation areas 438(1)(1)-438(M)(N) to the top surface of the first magnetization layer 412 (which may also be considered the top surface of a given common pinned layer 216(1)-216(M)), the individual MTJs 206(1)(1)-206(M)(N) in the MRAM array 202 illustrated in FIGS. 2A and 2B are formed from the MTJ layer 404. Similarly, in etching the portions of the supplemental mask layer 420 and the bottom mask layer 418 over the respective vias 236(1)(1)-236(M)(N), the MTJ hard masks 222(1)(1)-222(M)(N) as illustrated in FIGS. 2A and 2B are formed over the respective MTJ stacks 214(1)(1)-214(M)(N)

Similar to the fifth step of the double-patterning fabrication process 300 shown in FIG. 3 and discussed above, by using an IBE process using small-angle or larger-angle sputtering to further etch the MRAM array precursor stack 402 of the sixth fabrication stage 400(6) illustrated in FIGS. 9A and 9B, the first and second depth differentials 442 and 444 illustrated in FIGS. 8A and 8B are able to be approximately maintained because such exemplary IBE processes have an approximately one-to-one (1:1) etching selectivity between the various layers of the MRAM array precursor stack 402. However, like the sidewalls 448 of the remaining vertical columns 446 of the mask stack layer 406 in FIGS. 9A and 9B, since such exemplary IBE processes etch at an angle, the MTJ sidewalls 224(1)-224(M) can have a sidewall angle between approximately 60 degrees and 80 degrees after performing the sixth step in the double-patterning fabrication process 300 shown in FIG. 3. Etching processes, etchants, and sidewall angles such as those discussed above can also be included with respect to the sixth step in the double-patterning fabrication process 300 shown in FIG. 3. In this regard, the rows 208(1)-208(M) of MTJs 206(1)( )-206(M)( ) in the MRAM array 202 in the semiconductor die 200 illustrated in FIGS. 2A and 2B can be fabricated using a double-patterning fabrication process, such as the double-patterning fabrication process 300 shown in FIG. 3.

As noted above, MRAM arrays having rows of MTJs each having a common bottom electrode, like the MRAM array 202 illustrated in FIGS. 2A and 2B, can be implemented in memory systems for data storage applications. For example, the MRAM 204 employing the MRAM array 202 illustrated in FIG. 2A can be configured to employ an architecture and related supports that support read and write operations in the rows 208(1)-208(M) of MTJs 206(1)( )-206(M)( ) formed as MRAM bit cells of the MRAM 204, with each row 208(1)-208(M) having a respective common bottom electrode 212(1)-212(M).

Figure 10:
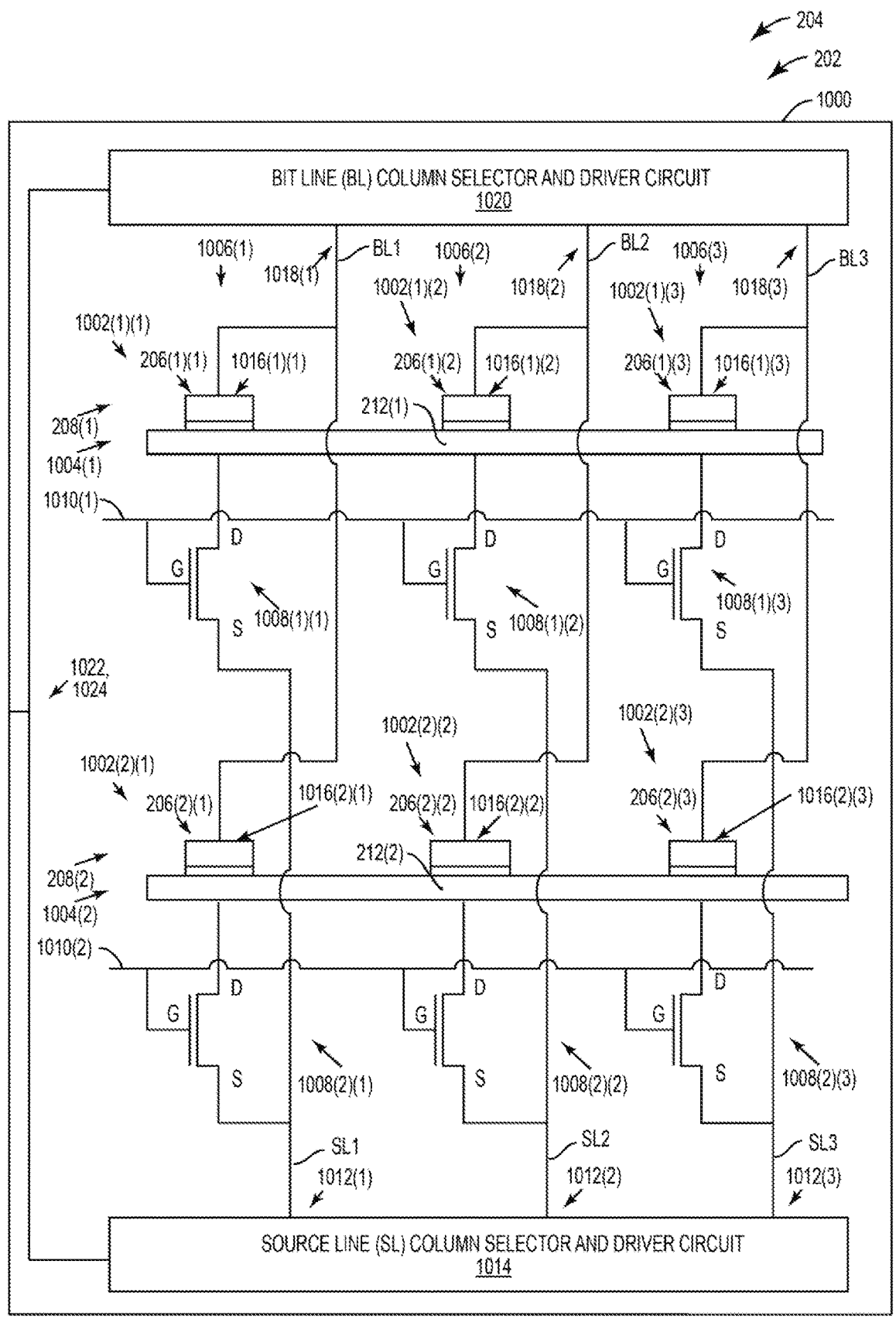
FIG. 10 illustrates an exemplary double-patterned MRAM array in an exemplary tri-state MRAM bit cell circuit.

In this regard, FIG. 10 is a circuit diagram of the exemplary double-patterned MRAM array 202 illustrated in FIGS. 2A and 2B in a MRAM bit cell circuit 1000. As illustrated in FIG. 10, a two-by-three (2×3) portion of the double-patterned MRAM array 202 implemented in the MRAM bit cell circuit 1000 includes six MRAM bit cells 1002(1)(1)-1002(2)(3) arranged in two rows 1004(1)-1004(2) and three columns 1006(1)-1006(3). In some aspects, additional MRAM bit cells in additional rows and columns may be used. Each MRAM bit cell 1002(1)(1)-1002(2)(3) of a given row 1004(1)-1004(2) includes an access transistor 1008(1)(1)-1008(2)(3) coupled to a respective common bottom electrode 212(1)-212(2) of a row 208(1)-208(2) of MTJs 206(1)(1)-206(2)(3). Each access transistor 1008(1)(1)-1008(2)(3) includes a gate (G), a drain (D), and a source (S). In this example, the drain (D) of each access transistor 1008(1)(1)-1008(2)(3) is coupled to a respective common bottom electrode 212(1)-212(2). First and second word lines (WL) 1010(1)-1010(2) are coupled to the gate (G) of each access transistor 1008(1)(1)-1008(2)(3) of a respective row 1004(1)-1004(2) of MRAM bit cells 1002(1)(1)-1002(2)(3). The source (S) of each access transistor 1008(1)(1)-1008(2)(3) is coupled by a respective source line (SL) to a respective source line output 1012(1)-1012(3) of a source line (SL) column selector and driver circuit 1014. A non-common top electrode 1016(1)(1)-1016(2)(3) of each MTJ 206(1)(1)-206(2)(3) is coupled by a respective bit line (BL) to a respective bit line (BL) output 1018(1)-1018(3) of a bit line (BL) column selector and driver circuit 1020. The MRAM bit cell circuit 1000 also includes an enable input 1022 configured to receive an enable signal, and a memory address input 1024 configured to receive a memory address.

The bit line (BL) column selector and driver circuit 1020 in this example is a tri-state selector and driver circuit. In this manner, the bit line (BL) column selector and driver circuit 1020 is configured to apply at least a high voltage, a low voltage (0 V), or a high impedance (Z) at each bit line (BL) output 1018(1)-1018(3). Thus, in this example, for a given bit line (BL) output 1018(1)-1018(3), the bit line (BL) column selector and driver circuit 1020 is configured to apply a read voltage $V_R$ as a high voltage at the bit line (BL) output 1018(1)-1018(3), a write voltage $V_W$ as a high voltage at the bit line (BL) output 1018(1)-1018(3), a low voltage (0 V) at the bit line (BL) output 1018(1)-1018(3), or a high impedance (Z) at the bit line (BL) output 1018(1)-1018(3). Similarly, the source line (SL) column selector and driver circuit 1014 in this example is a tri-state selector and driver circuit. Thus, in this example, for a given source line (SL) output 1012(1)-1012(3), the source line (SL) column selector and driver circuit 1014 is configured to apply a read voltage $V_R$ as a high voltage at the source line (SL) output 1012(1)-1012(3), a write voltage $V_W$ as a high voltage at the source line (SL) output 1012(1)-1012(3), a low voltage (0 V) at the source line (SL) output 1012(1)-1012(3), or a high impedance (Z) at the source line (SL) output 1012(1)-1012(3). By having both the bit line (BL) column selector and driver circuit 1020 and the source line (SL) column selector and driver circuit 1014 configured to apply one of three states at a given output, the MRAM bit cell circuit 1000 is able to apply a voltage differential between a selected source line (SL) output(s) 1012(1)-1012(3) and a selected bit line (BL) output(s) 1018(1)-1018(3) across a selected MRAM bit cell 1002(1)(1)-1002(2)(3) while applying a high impedance (Z) at other non-selected outputs to selectively isolate other MRAM bit cells 1002(1)(1)-1002(2)(3) of the MRAM bit cell circuit 1000 while performing a read or write operation on the selected MRAM bit cell 1002(1)(1)-1002(2)(3). In this manner, the MRAM 204 employing the MRAM array 202 illustrated in FIG. 2A can be configured to employ an architecture and related supports that support read and write operations in the rows 208(1)-208(M) of MTJs 206(1)(1)-206(M)(N) formed as MRAM bit cells of the MRAM 204, with each row 208(1)-208(M) having a respective common bottom electrode 212(1)-212(M).

With continuing reference to the example illustrated in FIG. 10, to perform a read operation, a read enable signal and an associated memory address can be received on the enable input 1022 and the memory address input 1024 of the MRAM bit cell circuit 1000. In this example, the enable input 1022 and the memory address input 1024 are coupled to both the source line (SL) column selector and driver circuit 1014 and the bit line (BL) column selector and driver circuit 1020 by a bus so that each selector and driver circuit 1014 and 1020 is configured to receive the read enable signal and the associated memory address. Once the read enable signal and the associated memory address are received by the MRAM bit cell circuit 1000, the gate (G) of the access transistor 1008(1)(1)-1008(2)(3) of the MRAM bit cell 1002(1)(1)-1002(2)(3) associated with the received memory address can be activated by activating a respective word line (WL) 1010(1)-1010(2). In this example, the MRAM bit cell 1002(1)(2) of the first row 1004(1) and second column 1006(2) of the MRAM bit cell circuit 1000 is the MRAM bit cell associated with the received memory address. Therefore, in this example, the first word line (WL) 1010(1) can be activated to activate the access transistor 1008(1)(2) of the selected MRAM bit cell 1002(1)(2). In this manner, each access transistor 1008(1)(1)-1008(1)(3) in the first row 1004(1) of MRAM bit cells 1002(1)(1)-1002(1)(3) is also activated.

To perform the read operation at the received memory address, the MRAM bit cell circuit 1000 can apply a voltage differential across the MRAM bit cell 1002(1)(2) associated with the received memory address while the respective access transistor 1008(1)(2) is activated. In this regard, the bit line (BL) column selector and driver circuit 1020 of the MRAM bit cell circuit 1000 in this example can apply a read voltage $V_R$ at the second bit line (BL2) output 1018(2) and the source line (SL) column selector and driver circuit 1014 can apply a low voltage (0 V) at the second source line (SL2) output 1012(2) to apply a desired read voltage differential across the selected MRAM bit cell 1002(1)(2) to perform a read operation. In this manner, the read voltage $V_R$ can be applied across the selected MRAM bit cell 1002(1)(2) in a column 1006(2) indicated by the received memory address. By sensing a resistance of the selected MRAM bit cell 1002(1)(2), the MRAM bit cell circuit 1000 can determine a logical state of the MRAM bit cell 1002(1)(2) to determine the data stored in the selected MRAM bit cell 1002(1)(2). Since the second word line (WL) 1010(2) is not activated in this example, a voltage differential may not be applied across the non-selected MRAM bit cell 1002(2)(2) in the second row 1004(2) and second column 1006(2) of the MRAM bit cell circuit 1000. In this manner, the non-selected MRAM bit cell 1002(2)(2) is isolated from the voltage differential associated with the read operation. Further, the MRAM bit cell circuit 1000 is able to isolate other non-selected MRAM bit cells 1002(1)(1)-1002(2)(3) from the voltage differential associated with the read operation by using the column selector and driver circuits 1014 and 1020 in this example to apply a high impedance (Z) at the source line (SL) outputs 1012(1)-1012(3) and the bit line (BL) outputs 1018(1)-1018(3) corresponding to the non-indicated columns. Thus, by applying a high voltage of a read voltage $V_R$, a low voltage (0 V), and a high impedance (Z) at determined source line (SL) and bit line (BL) outputs 1012(1)-1012(3) and 1018(1)-1018(3) of the MRAM bit cell circuit 1000, a read operation can be performed at a received memory address to read data stored in a selected MRAM bit cell of an MRAM array having a common bottom electrode, such as the MRAM array 202 illustrated in FIGS. 2A and 2B.

As a second example of performing read and write operations in the MRAM bit cell circuit 1000 illustrated in FIG. 10, to perform a write operation, a write enable signal and an associated memory address are received on the enable input 1022 and the memory address input 1024, respectively, of the MRAM bit cell circuit 1000. In this example, a write low operation will be discussed as being performed on the MRAM bit cell 1002(1)(2) of the first row 1004(1) and second column 1006(2) of the MRAM bit cell circuit 1000, because, in this example, the received write enable signal is a write low enable signal and the selected MRAM bit cell 1002(1)(2) is associated with the received memory address. In this regard, the state of the MTJ 206(1)(2) of the selected MRAM bit cell 1002(1)(2) will be written from an anti-parallel (AP) state to a parallel (P) state (i.e., a logical '0').

Similar to the read operation discussed above, once the write low enable signal and the associated memory address are received by the MRAM bit cell circuit 1000, the gate (G) of the access transistor 1008(1)(2) of the selected MRAM bit cell 1002(1)(2) associated with the received memory address can be activated by activating the first word line (WL) 1010(1). By activating the first word line (WL) 1010(1), each access transistor 1008(1)(1)-1008(1)(3) in the first row 1004(1) of MRAM bit cells 1002(1)(1)-1002(1)(3) can also be activated. While the access transistor 1008(1)(2) of the selected MRAM bit cell 1002(1)(2) is activated, the MRAM bit cell circuit 1000 can apply a voltage differential across the selected MRAM bit cell 1002(1)(2) to write a low state to the MTJ 206(1)(2) of the selected MRAM bit cell 1002(1)(2). In this regard, the bit line (BL) column selector and driver circuit 1020 of the MRAM bit cell circuit 1000 in this example can apply a write voltage $V_W$ at the second bit line (BL2) output 1018(2), and the source line (SL) column selector and driver circuit 1014 can apply a low voltage (0 V) at the second source line (SL2) output 1012(2) to apply a desired write voltage differential across the selected MRAM bit cell 1002(1)(2). In this manner, the write voltage $V_W$ can be applied across the selected MRAM bit cell 1002(1)(2) in a column 1006(2) indicated by the received memory address. By applying the write voltage $V_W$ across the selected MRAM bit cell 1002(1)(2), a write current $I_W$ can be generated from the second source line (SL2) to the second bit line (BL2), in this example, so that the spin polarization of the carrier electrons of the write current $I_W$ can be used to write the MTJ 206(1)(2) of the selected MRAM bit cell 1002(1)(2) to a P state.

Similar to the read operation discussed above, since the second word line (WL) 1010(2) is not activated in this example, a voltage differential may not be applied across the non-selected MRAM bit cell 1002(2)(2) in the second row 1004(2) and second column 1006(2) of the MRAM bit cell circuit 1000. In this manner, the non-selected MRAM bit cell 1002(2)(2) is isolated from the voltage differential associated with the write low operation. Further, like the read operation discussed above, the MRAM bit cell circuit 1000 can isolate other non-selected MRAM bit cells 1002(1)(1)-1002(2)(3) from the voltage differential associated with the write low operation by using the column selector and driver circuits 1014 and 1020 in this example to apply a high impedance (Z) at the bit line (BL) outputs 1018(1)-1018(3) corresponding to the non-indicated columns. However, since the MRAM bit cell circuit 1000 has a common bottom electrode 212(1)-212(2) for each row 1004(1)-1004(2) of MRAM bit cells 1002(1)(1)-1002(2)(3), the current across the access transistor 1008(1)(2) of the selected MRAM bit cell 1002(1)(2) can be reduced by spreading the current across access transistors 1008(1)(1) and 1008(1)(3) of non-selected MRAM bit cells 1002(1)(1) and 1002(1)(3) by applying a low voltage (0 V) at the first and third source line (SL1 and SL3) outputs 1012(1) and 1012(3) different from the second source line (SL2) output 1012(2) coupled to the selected MRAM bit cell 1002(1)(2). In applying the low voltage (0 V) at the first and third source line (SL1 and SL3) outputs 1012(1) and 1012(3), the write voltage $V_W$ applied to the second bit line (BL2) output 1018(2) is drawn across the access transistors 1008(1)(1) and 1008(1)(3) of the non-selected MRAM bit cells 1002(1)(1) and 1002(1)(3). In this manner, the current across the access transistor 1008(1)(2) of the selected MRAM bit cell 1002(1)(2) is reduced. Since the current across the access transistor 1008(1)(2) can be reduced as a result of the MRAM bit cell circuit 1000 having a common bottom electrode 212(1)-212(2) for each row 1004(1)-1004(2) of MRAM bit cells 1002(1)(1)-1002(2)(3), the access transistor 1008(1)(1)-1008(2)(3) can also be reduced, thereby providing improved scaling in MRAM for increased MRAM bit cell density.

As a third example of performing read and write operations in the MRAM bit cell circuit 1000 illustrated in FIG. 10, to perform a write high operation, a write high enable signal and an associated memory address are received on the enable input 1022 and the memory address input 1024, respectively, of the MRAM bit cell circuit 1000. In this regard, the state of the MTJ 206(1)(2) of the selected MRAM bit cell 1002(1)(2) will be written from a P state to an AP state (i.e., a logical '1'). Similar to the write low operation discussed above, once the write high enable signal and the associated memory address are received by the MRAM bit cell circuit 1000, the gate (G) of the access transistor 1008(1)(2) of the selected MRAM bit cell 1002(1)(2) associated with the received memory address can be activated by activating the first word line (WL) 1010(1). By activating the first word line (WL) 1010(1), each access transistor 1008(1)(1)-1008(1)(3) in the first row 1004(1) of MRAM bit cells 1002(1)(1)-1002(1)(3) can also be activated. While the access transistor 1008(1)(2) of the selected MRAM bit cell 1002(1)(2) is activated, the MRAM bit cell circuit 1000 can apply a voltage differential across the selected MRAM bit cell 1002(1)(2) to write a high state to the MTJ 206(1)(2) of the selected MRAM bit cell 1002(1)(2). In this regard, the bit line (BL) column selector and driver circuit 1020 of the MRAM bit cell circuit 1000 in this example can apply a low voltage (0 V) at the second bit line (BL2) output 1018(2) and the source line (SL) column selector and driver circuit 1014 can apply a write voltage $V_W$ at the second source line (SL2) output 1012(2) to apply a desired write voltage differential across the selected MRAM bit cell 1002(1)(2). In this manner, the write voltage $V_W$ can be applied across the selected MRAM bit cell 1002(1)(2) in a column 1006(2) indicated by the received memory address. By applying the write voltage $V_W$ across the selected MRAM bit cell 1002(1)(2), a write current $I_W$ can be generated from the second bit line (BL2) to the second source line (SL2), in this example, so that the spin polarization of the carrier electrons of the write current $I_W$ can be used to write the MTJ 206(1)(2) of the selected MRAM bit cell 1002(1)(2) to an AP state.

Similar to the read operation discussed above, since the second word line (WL) 1010(2) is not activated in this example, a voltage differential may not be applied across the non-selected MRAM bit cell 1002(2)(2) in the second row 1004(2) and second column 1006(2) of the MRAM bit cell circuit 1000. In this manner, the non-selected MRAM bit cell 1002(2)(2) is isolated from the voltage differential associated with the write high operation. Further, like the read operation discussed above, the MRAM bit cell circuit 1000 can isolate other non-selected MRAM bit cells 1002(1)(1)-1002(2)(3) from the voltage differential associated with the write high operation by using the column selector and driver circuits 1014 and 1020 in this example to apply a high impedance (Z) at the bit line (BL) outputs 1018(1)-1018(3) corresponding to the non-indicated columns. However, due to the MRAM bit cell circuit 1000 having a common bottom electrode 212(1)-212(2) for each row 1004(1)-1004(2) of MRAM bit cells 1002(1)(1)-1002(2)(3), the write current $I_W$ can be increased by also applying a high voltage $V_W$ at the first and third source line (SL1 and SL3) outputs 1012(1) and 1012(3) different from the first source line (SL1) output 1012(1) coupled to the selected MRAM bit cell 1002(1)(2). By applying the high voltage $V_W$ at these additional source line (SL) outputs, the write current $I_W$ can be increased to approximately three times the current of the write current $I_W$ without the additional high voltage applications, thereby providing faster write times if desirable. In this manner, a write high operation can be performed to store data in an MTJ of a selected MRAM bit cell of an MRAM array having a common bottom electrode, such as the MRAM array 202 illustrated in FIGS. 2A and 2B, with reduced write operation times.

In another aspect, a semiconductor die is provided that includes a means for storing data in an array in the semiconductor die. The means for storing data in an array can include the MRAM array 202 in FIGS. 2A, 2B, and 10, as non-limiting examples. The means for storing data in an array in this example includes a first means for storing data and a second means for storing data. The first means for storing data and the second means for storing data can each include an MTJ stack of the MTJ stacks 214(1)(1)-214(M)(N) in FIGS. 2A, 2B, and 3, as non-limiting examples. The means for storing data in an array in this example also includes a first means for protecting the first means for storing data and a second means for protecting the second means for storing data. The first means for protecting the first means for storing data and the second means for protecting the second means for storing data can each include an MTJ hard mask of the MTJ hard masks 222(1)(1)-222(M)(N) in FIGS. 2A, 2B, and 3, as non-limiting examples. The means for storing data in an array in this example also includes a common means for conducting current, which can include a common bottom electrode of the common bottom electrodes 212(1)-212(M) in FIGS. 2A, 2B, 3, and 10, as non-limiting examples. The means for storing data in an array in this example also includes a first means for storing a programmable magnetic moment having a first programmable magnetic moment and a second means for storing a programmable magnetic moment having a second programmable magnetic moment. The first means for storing a programmable magnetic moment and the second means for storing a programmable magnetic moment can each include a free layer of the free layers 220(1)-220(M) in FIGS. 2B and 9B, as non-limiting examples. The first programmable magnetic moment and the second programmable magnetic moment can each include the magnetic moment $M_{FL}$, as a non-limiting example. The means for storing data in an array in this example also includes a first means for storing a fixed magnetic moment having a first fixed magnetic moment and a second means for storing a fixed magnetic moment having a second fixed magnetic moment. The first means for storing a fixed magnetic moment and the second means for storing a fixed magnetic moment can each include a non-common pinned layer and/or a common pinned layer of the common pinned layers 216(1)-216(M) in FIGS. 2A and 2B, as non-limiting examples. The first fixed magnetic moment and the second magnetic moment can each include the magnetic moment $M_{PL}$, as a non-limiting example. The means for storing data in an array in this example also includes a first means for transferring spin polarization of electrons and a second means for transferring spin polarization of electrons, which each can include a tunnel barrier of the tunnel barriers 218(1)-218(M) in FIGS. 2B and 9B, as non-limiting examples.

The double-patterned MRAM for reducing MTJ pitch for increased MRAM bit cell density according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 11:
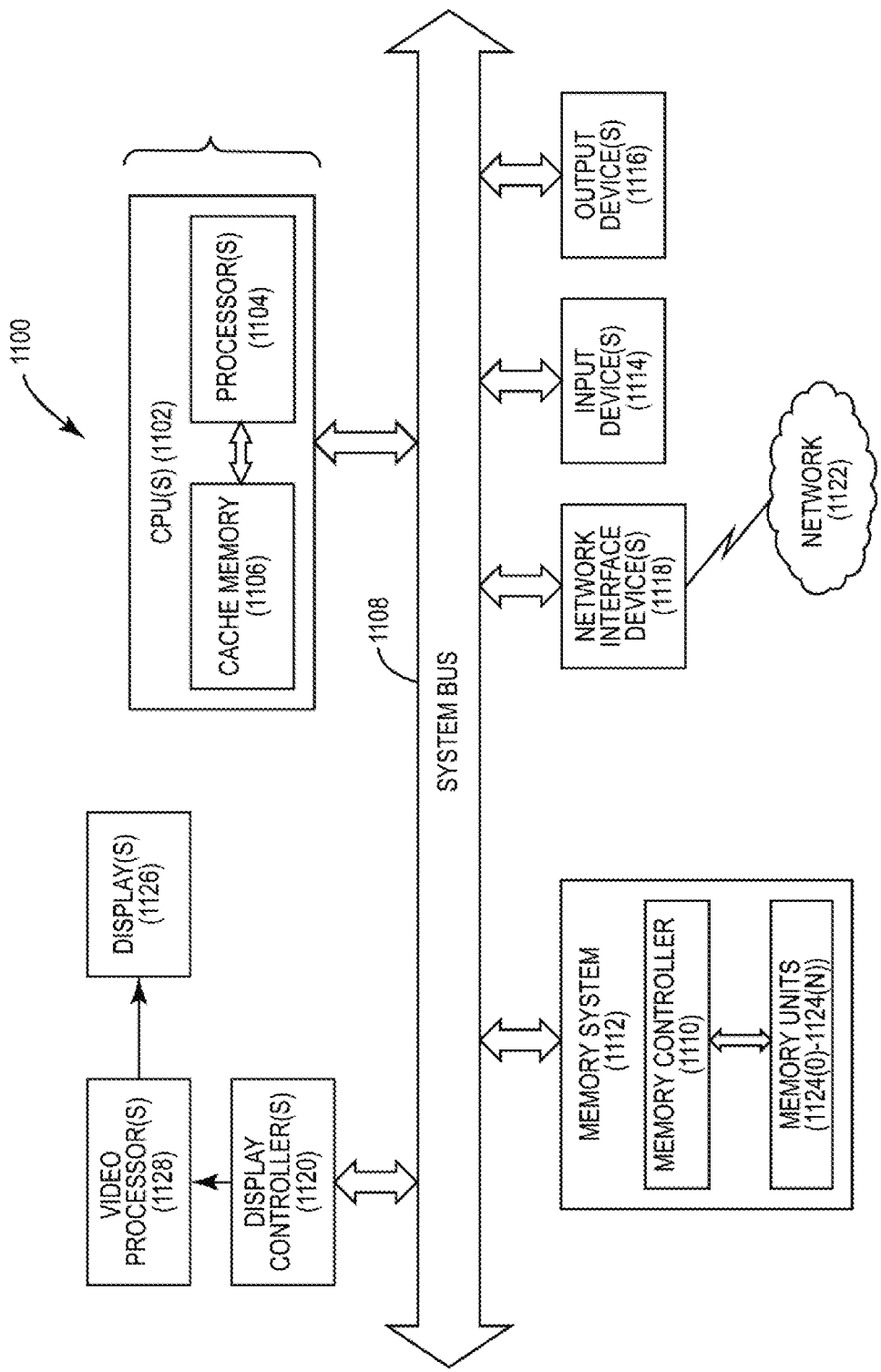
FIG. 11 is a block diagram of an exemplary processor-based system that can include a double-patterned MRAM array(s) having rows of MTJs, wherein each row of MTJs has a common bottom electrode to reduce MTJ pitch to increase MRAM bit cell density.

In this regard, FIG. 11 illustrates an example of a processor-based system 1100 that can employ double-patterned MRAM for reducing MTJ pitch for increased MRAM bit cell density illustrated in FIGS. 2A and 2B. In this example, the processor-based system 1100 includes one or more central processing units (CPUs) 1102, each including one or more processors 1104. The CPU(s) 1102 may have cache memory 1106 coupled to the processor(s) 1104 for rapid access to temporarily stored data. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 as an example of a slave device. Although not illustrated in FIG. 11, multiple system buses 1108 could be provided, wherein each system bus 1108 constitutes a different fabric.

Other master and slave devices can be connected to the system bus 1108. As illustrated in FIG. 11, these devices can include a memory system 1112, one or more input devices 1114, one or more output devices 1116, one or more network interface devices 1118, and one or more display controllers 1120, as examples. The input device(s) 1114 can include any type of input device, including, but not limited to, input keys, switches, voice processors, etc. The output device(s) 1116 can include any type of output device, including, but not limited to, audio, video, other visual indicators, etc. The network interface device(s) 1118 can be any devices configured to allow exchange of data to and from a network 1122. The network 1122 can be any type of network, including networks such as the phone network and the Internet. The network interface device(s) 1118 can be configured to support any type of communications protocol desired. The memory system 1112 can include one or more memory units 1124(0)-1124(N).

The CPU(s) 1102 may also be configured to access the display controller(s) 1120 over the system bus 1108 to control information sent to one or more displays 1126. The display controller(s) 1120 sends information to the display(s) 1126 to be displayed via one or more video processors 1128, which process the information to be displayed into a format suitable for the display(s) 1126. The display(s) 1126 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A magneto-resistive random access memory (MRAM) bit cell circuit, comprising:
   a first row of a plurality of MRAM bit cells comprising a first common bottom electrode, each MRAM bit cell of the first row in a column of a plurality of columns and comprising:
  a first top electrode;
  a first magnetic tunnel junction (MTJ) stack between the first top electrode and the first common bottom electrode, comprising:
    a first pinned layer;
    a first free layer; and
    a first tunnel barrier between the first pinned layer and the first free layer; and
  a first access transistor coupled to the first common bottom electrode;
a first word line (WL) coupled to a gate of each first access transistor of the first row of the plurality of MRAM bit cells;
a bit line (BL) column selector and driver circuit comprising:
  a plurality of bit line (BL) outputs; and
  a plurality of bit lines (BLs) each coupled to the first top electrode of an MRAM bit cell in a respective column and to a corresponding bit line (BL) output;
a source line (SL) column selector and driver circuit comprising:
  a plurality of source line (SL) outputs; and
  a plurality of source lines (SLs) each coupled to the first access transistor of an MRAM bit cell in a respective column and to a corresponding source line (SL) output;
an enable input configured to receive an enable signal; and
a memory address input configured to receive a memory address.

2. The MRAM bit cell circuit of claim 1, further comprising:
a second row of the plurality of MRAM bit cells comprising a second common bottom electrode, each MRAM bit cell of the second row in a column of the plurality of columns and comprising:
  a second top electrode;
  a second MTJ stack between the second top electrode and the second common bottom electrode, comprising:
    a second pinned layer;
    a second free layer; and
    a second tunnel barrier between the second pinned layer and the second free layer; and
  a second access transistor coupled to the second common bottom electrode;
a second word line (WL) coupled to a gate of each second access transistor of the second row of the plurality of MRAM bit cells; wherein:
  each bit line (BL) coupled to the first top electrode of an MRAM bit cell in a respective column and to a corresponding bit line (BL) output is also coupled to the second top electrode of an MRAM bit cell in the respective column; and
  each source line (SL) coupled to the first access transistor of an MRAM bit cell in a respective column and to a corresponding source line (SL) output is also coupled to the second access transistor of an MRAM bit cell in the respective column.

3. The MRAM bit cell circuit of claim 1, wherein:
for each bit line (BL) output, the bit line (BL) column selector and driver circuit is configured to apply a read voltage at the bit line (BL) output, a write voltage at the bit line (BL) output, a low voltage at the bit line (BL) output, or a high impedance at the bit line (BL) output; and
for each source line (SL) output, the source line (SL) column selector and driver circuit is configured to apply a read voltage at the source line (SL) output, a write voltage at the source line (SL) output, a low voltage at the source line (SL) output, or a high impedance at the source line (SL) output.

4. The MRAM bit cell circuit of claim 3, wherein the MRAM bit cell circuit is configured to, in response to receiving a memory address on the memory address input and an enable signal representing a read on the enable input:
  activate each access transistor in an indicated row of the plurality of MRAM bit cells by applying an activation voltage across a word line (WL) corresponding to the indicated row, wherein the indicated row is based on the received memory address; and
  apply the read voltage across an MRAM bit cell in an indicated column, wherein the indicated column is based on the received memory address.

5. The MRAM bit cell circuit of claim 3, wherein the MRAM bit cell circuit is configured to, in response to receiving a memory address on the memory address input and an enable signal representing a read on the enable input:
  activate each access transistor in an indicated row of the plurality of MRAM bit cells by applying an activation voltage across a word line (WL) corresponding to the indicated row, wherein the indicated row is based on the received memory address;
  apply the read voltage at the bit line (BL) output corresponding to an MRAM bit cell in an indicated column, wherein the indicated column is based on the received memory address;
  apply the low voltage at the source line (SL) output corresponding to the MRAM bit cell in the indicated column; and
  apply the high impedance at each bit line (BL) output and source line (SL) output corresponding to an MRAM bit cell in a non-indicated column different from the indicated column.

6. The MRAM bit cell circuit of claim 3, wherein the MRAM bit cell circuit is configured to, in response to receiving a memory address on the memory address input and an enable signal representing a read on the enable input:
  activate each access transistor in an indicated row of the plurality of MRAM bit cells by applying an activation voltage across a word line (WL) corresponding to the indicated row, wherein the indicated row is based on the received memory address;
  apply the read voltage at the source line (SL) output corresponding to an MRAM bit cell in an indicated column, wherein the indicated column is based on the received memory address;
  apply the low voltage at the bit line (BL) output corresponding to the MRAM bit cell in the indicated column; and
  apply the high impedance at each bit line (BL) output and source line (SL) output corresponding to an MRAM bit cell in a non-indicated column different from the indicated column.

7. The MRAM bit cell circuit of claim 3, wherein the MRAM bit cell circuit is configured to, in response to receiving a memory address on the memory address input and an enable signal representing a write on the enable input:
  activate each access transistor in an indicated row of the plurality of MRAM bit cells by applying an activation voltage across a word line (WL) corresponding to the indicated row, wherein the indicated row is based on the received memory address; and apply the write voltage at the bit line (BL) output corresponding to an MRAM bit cell in an indicated column, wherein the indicated column is based on the received memory address;

apply the low voltage at selected source line (SL) outputs of the plurality of source line (SL) outputs;

apply the high impedance at unselected source line (SL) outputs different from the selected source line (SL) outputs; and apply the high impedance at each bit line (BL) output corresponding to an MRAM bit cell in a non-indicated column different from the indicated column.

8. The MRAM bit cell circuit of claim 3, wherein the MRAM bit cell circuit is configured to, in response to receiving a memory address on the memory address input and an enable signal representing a write on the enable input:

activate each access transistor in an indicated row of the plurality of MRAM bit cells by applying an activation voltage across a word line (WL) corresponding to the indicated row, wherein the indicated row is based on the received memory address; and apply the write voltage at selected source line (SL) outputs of the plurality of source line (SL) outputs, wherein the indicated column is based on the received memory address;

apply the low voltage at the bit line (BL) output corresponding to an MRAM bit cell in an indicated column, wherein the indicated column is based on the received memory address;

apply the high impedance at unselected source line (SL) outputs different from the selected source line (SL) outputs; and apply the high impedance at each bit line (BL) output corresponding to an MRAM bit cell in a non-indicated column different from the indicated column.

9. The MRAM bit cell circuit of claim 1, wherein the first pinned layer of each MRAM bit cell among the first row of the plurality of MRAM bit cells comprises a first common pinned layer disposed over the first common bottom electrode.

10. The MRAM bit cell circuit of claim 9, wherein the first tunnel barrier of each MRAM bit cell among the first row of the plurality of MRAM bit cells comprises a common tunnel barrier disposed over the common pinned layer.

11. The MRAM bit cell circuit of claim 10, wherein the first free layer of each MRAM bit cell among the first row of the plurality of MRAM bit cells is disposed over the common tunnel barrier.

* * * * *